(12) United States Patent
Umemoto et al.

(10) Patent No.: US 6,816,038 B2
(45) Date of Patent: Nov. 9, 2004

(54) MAGNETOSTATIC WAVE DEVICE AND DISTURBANCE WAVE ELIMINATOR

(75) Inventors: Takashi Umemoto, Hirakata (JP); Kouji Yamano, Hirakata (JP); Atsushi Maeda, Saitama (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 0 days.

(21) Appl. No.: 09/988,815

(22) Filed: Nov. 20, 2001

(65) Prior Publication Data

US 2002/0097115 A1 Jul. 25, 2002

(30) Foreign Application Priority Data

Nov. 22, 2000 (JP) ........................................ 2000-355214
Nov. 22, 2000 (JP) ........................................ 2000-355215
Dec. 28, 2000 (JP) ........................................ 2000-400628

(51) Int. Cl.[7] ................................................ H01P 7/00
(52) U.S. Cl. .................................................... 333/219.2
(58) Field of Search ............................ 333/219, 219.2, 333/202, 142, 186

(56) References Cited

U.S. PATENT DOCUMENTS

| 4,528,529 A | | 7/1985 | Huijer ........................ 333/219 |
| 4,554,519 A | * | 11/1985 | Adam ......................... 333/141 |
| 4,777,462 A | * | 10/1988 | Kunz et al. .................. 333/219 |
| 4,983,937 A | * | 1/1991 | Kinoshita et al. ........... 333/202 |

FOREIGN PATENT DOCUMENTS

| JP | 2-58401 | | 2/1990 | |
| JP | 10004301 A | * | 1/1998 | ........... H01P/1/215 |

* cited by examiner

Primary Examiner—Stephen E. Jones
(74) Attorney, Agent, or Firm—Armstrong, Kratz, Quintos, Hanson & Brooks, LLP

(57) ABSTRACT

A YIG film formed on a GGG substrate is separated by a stepwise groove for preparing YIG films having different intervals between end surfaces, and two YIG films resonating magnetostatic waves between the end surfaces having different intervals are coupled with each other thereby forming a resonator.

9 Claims, 20 Drawing Sheets

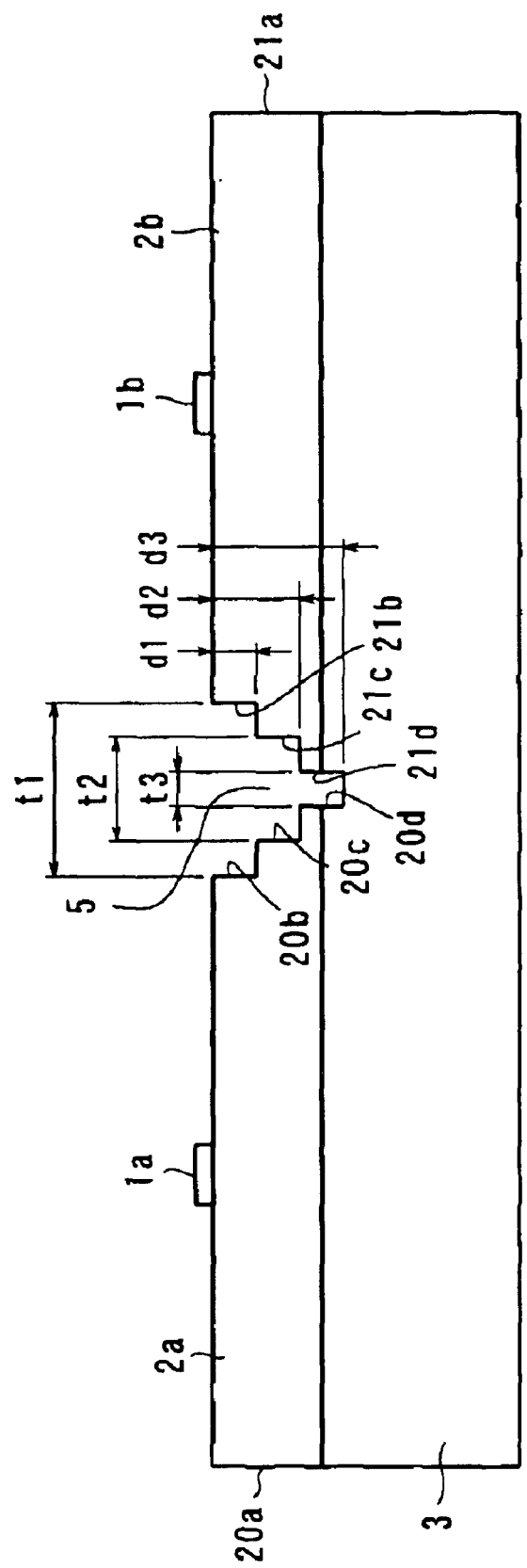
F I G. 2

F I G. 1 7
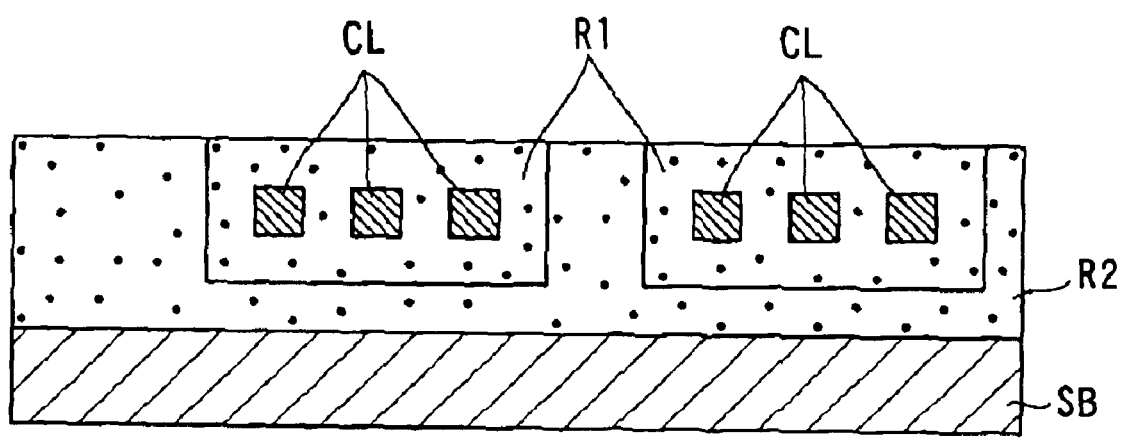

MAGNETOSTATIC WAVE DEVICE AND DISTURBANCE WAVE ELIMINATOR

BACKGROUND OF THE INVENTION

1. Field of the Invention

The present invention relates to a magnetostatic wave device employing a magnetostatic wave material propagating magnetostatic waves and a disturbance wave eliminator employing this magnetostatic wave device, and more particularly, it relates to a magnetostatic wave device eliminating a disturbance wave from an input signal and a disturbance wave eliminator employing this magnetostatic wave device.

2. Description of the Related Art

Various studies have recently been made as to a magnetostatic wave device employing a YIG (yttrium-ion-garnet) film. For example, a straight edge resonator (SER) formed by rectangularly cutting a YIG film for resonating magnetostatic waves between opposite end surfaces or the like is proposed as a magnetostatic wave device applied to a high-frequency filter or the like.

FIG. 18 is a schematic perspective vie showing the structure of the aforementioned straight edge resonator as an exemplary conventional magnetostatic wave device.

As shown in FIG. 18, a dielectric substrate 116 is arranged on a conductor 114, a YIG film 112 is arranged on the dielectric substrate 116, and a GGG (gadolinium-gallium-garnet) substrate 113 is arranged on the YIG film 112. An input electrode 111a and an output electrode 111b are arranged on portions of the dielectric substrate 116 located on both sides of the YIG film 112. The YIG film 112 and the GGG substrate 113 are rectangularly worked for resonating magnetostatic waves between the longitudinal end surfaces (end surfaces parallel to the input electrode 111a and the output electrode 111b) of the YIG film 112 thereby forming a straight edge resonator.

According to the aforementioned structure, the input electrode 111a receiving an input signal generates a high-frequency magnetic field corresponding to this input signal. At this time, a dc magnetic field H is applied in a direction parallel to the input electrode 111a and the output electrode 111b and the high-frequency magnetic field generated from the input electrode 111a induces a magnetostatic wave in the YIG film 112, so that this magnetostatic wave propagates through the YIG film 112 and resonates between the longitudinal end surfaces. The output electrode 111b converts this magnetostatic wave to an electric signal, which in turn is taken out as an output signal. Thus, the magnetostatic wave device shown in FIG. 18 functions as a high-frequency filter passing a prescribed high-frequency signal corresponding to the resonance frequency therethrough.

The aforementioned conventional magnetostatic wave device can provide a miniature resonator of 1.4 mm by 4 mm having a dominant mode formed by the resonance of the magnetostatic wave between the longitudinal end surfaces of the YIG film 112. However, the resonance of the dominant mode interferes with resonance of a mode between end surfaces (end surfaces along a direction perpendicular to the input electrode 111a and the output electrode 111b) of the YIG film 112 opposed in the longitudinal direction to result in double-humped resonance.

A magnetostatic wave device formed by coupling two straight edge resonators with each other for increasing the pass bandwidth of the aforementioned conventional magnetostatic wave device is also proposed. FIG. 19 is a schematic perspective view showing the structure of another conventional magnetostatic wave device formed by coupling two straight edge resonators with each other.

The magnetostatic wave device shown in FIG. 19 comprises two YIG films 112a and 112b arranged between a GGG substrate 113 and a dielectric substrate 116 so that the inner opposite end surfaces of the two YIG films 112a and 112b are parallel to each other through a space S. In this magnetostatic wave device, the two YIG films 112a and 112b functioning as straight edge resonators respectively are coupled with each other, and the strength of this coupling is changed by varying the space S between the YIG films 112a and 112b.

FIG. 20 shows the frequency characteristics of the conventional magnetostatic wave device shown in FIG. 19. When the space S is not more than about 1 mm, for example, the insertion loss is about 15 dB, the 3 dB bandwidth is about 10 MHz and the degree of suppression is about 25 dB, as shown in FIG. 20. Thus, the pass bandwidth can be increased beyond that of the magnetostatic wave device shown in FIG. 18.

Employment of a magnetostatic wave device for eliminating a narrowband disturbance wave superposed on a spectrally diffused input signal of the 2.4 GHz is recently proposed in relation to a spread spectrum communication system employed for a radio LAN (local area network) or the like. In this case, the magnetostatic wave device requires a broad bandwidth of at least about 30 MHz as the 3 dB bandwidth. Therefore, a YIG single-crystalline thin film filtering an input signal in all propagable bands for magnetostatic waves with no frequency selectivity is employed for the magnetostatic wave device. In this case, the pass bandwidth is about 900 MHz, and the insertion loss is about 10 dB.

However, the pass bandwidth of the conventional magnetostatic wave device having the 3 dB bandwidth of about 10 MHz is too narrow for serving as the magnetostatic wave device employed for the radio LAN or the like, although the pass bandwidth can be spread as compared with the conventional magnetostatic wave device shown in FIG. 18. Further, the insertion loss of about 15 dB is too large. Also in this point, the conventional magnetostatic wave device shown in FIG. 19 cannot be applied to the radio LAN or the like.

In the aforementioned conventional magnetostatic wave device employed for the radio LAN or the like, the frequency characteristics of the pass bandwidth are so inferior in flatness that the same may exert bad influence on demodulation of an output signal after filtering, although the pass bandwidth is sufficient.

While the insertion loss of the conventional magnetostatic wave device shown in FIG. 19 can be improved to some extent by reducing the space S, the degree of suppression is so reduced in this case that the magnetostatic wave device cannot pass only a desired high-frequency signal. When the space S is increased to the contrary, the insertion loss is so increased that the magnetostatic wave device cannot pass the desired high-frequency signal without loss although the degree of suppression can be improved to some extent.

A magnetostatic wave device applied to a disturbance wave eliminator is now described.

FIG. 21 is a perspective view showing the structure of still another conventional magnetostatic wave device. In this conventional magnetostatic wave device, a YIG (yttrium-iron-garnet) film 100 is formed on a GGG (gadoliniumgallium-garnet) substrate 200 while an input antenna electrode 300 and an output antenna electrode 400 are formed on the YIG film 100, as shown in FIG. 21.

The operation principle of the magnetostatic wave device is now described. When a dc magnetic field H is applied to the YIG film 100 with constant strength, the directions of magnetic dipoles of electrons are oriented toward the magnetic field H. When a high-frequency magnetic field is locally applied in this case, magnetic dipoles around the high-frequency magnetic field cause precession. This precession of the magnetic dipoles is transmitted to adjacent magnetic dipoles due to interaction between the magnetic dipoles, to successively propagate through the YIG film 100. This wave, having a slow speed and dominant magnetic energy, is referred to as a magnetostatic wave.

In the conventional magnetostatic wave device shown in FIG. 21, a high-frequency magnetic field generated from the input antenna electrode 300 induces a magnetostatic surface wave in the YIG film 100 through the aforementioned operation principle, and this magnetostatic surface wave propagates between the input antenna electrode 300 and the output antenna electrode 400. The output antenna electrode 400 converts the propagating magnetostatic wave to an electric signal and takes out the same.

At this time, a signal input in the input antenna electrode 300 is passed when the signal level is lower than the saturation level of the magnetostatic wave device on a frequency axis, while a signal exceeding the saturation level is limited to an output saturation level and taken out from the output antenna electrode 400. Through such properties, the magnetostatic wave device shown in FIG. 21 is applied to a disturbance wave eliminator as a magnetostatic wave filter.

FIG. 22 is a block diagram showing the structure of a conventional disturbance wave eliminator employing the magnetostatic wave device shown in FIG. 21.

The disturbance wave eliminator shown in FIG. 22 comprises an antenna 101, an amplifier 102, a magnetostatic wave filter 103, a back diffuser 104 and a demodulator 105. The magnetostatic wave device shown in FIG. 21 is employed for the magnetostatic wave filter 103.

The antenna 101 receives a diffusion signal spectrally diffused in the direct sequence system and outputs the signal to the amplifier 102. The amplifier 102 amplifies the received diffusion signal to the saturation level of the magnetostatic wave filter 103 and outputs the amplified signal to the magnetostatic wave filter 103. The magnetostatic wave filter 103 attenuates a signal, included in the input signal, exceeding the saturation level to an output saturation level and outputs this signal to the back diffuser 104. The back diffuser 104 back-diffuses the signal limited to the output saturation level by the magnetostatic wave filter 103 and outputs the back-diffused signal to the demodulator 105. The demodulator 105 demodulates the back-diffused signal and outputs the demodulated signal to an output terminal OT.

Operations of the conventional disturbance wave eliminator having the aforementioned structure are now described. FIGS. 23(*a*) and 23(*b*) illustrate the spectra of an input signal and an output signal in and from the magnetostatic wave filter 103 shown in FIG. 22, respectively.

The antenna 101 receives a diffusion signal spectrally diffused with a certain specific pseudo-noise code and a disturbance wave mixed into this diffusion signal. The diffusion signal has spectral characteristics diffused over a wide frequency range at a low level, while the disturbance wave has high-level spectral characteristics in a narrow frequency range in the vicinity of the center frequency of the diffusion signal.

FIG. 23(*a*) shows the spectrum of the diffusion signal output from the amplifier 102. As shown in FIG. 23(*a*), the amplifier 102 amplifies the diffusion signal to the saturation level of the magnetostatic wave filter 103, and outputs an amplified diffusion signal a1. The amplifier 102 also amplifies the disturbance wave to a disturbance wave b1.

FIG. 23(*b*) shows the spectrum of the diffusion signal output from the magnetostatic wave filter 103. As shown in FIG. 23(*b*), the magnetostatic wave filter 103 operates as a band-pass magnetostatic wave filter passing a signal having a frequency within a pass band P1, for passing a signal up to the aforementioned saturation level while attenuating a signal exceeding the saturation level to the output saturation level. Therefore, the diffusion signal a1 passes through the magnetostatic wave filter 103 to form a diffusion signal a2, while the disturbance wave b1 is attenuated to a level equivalent to the level of the diffusion signal a2 to form a disturbance wave b2.

Thereafter the back diffuser 104 multiplies the output signal from the magnetostatic wave filter 103 by a code identical to the pseudo-noise code used on a transmission side for back-diffusing the same so that the diffusion signal forms a high-level signal in the original narrowband. On the contrary, the disturbance wave is spectrally diffused to form a disturbance wave diffused over a wide frequency range at a low level. Finally, the demodulator 105 demodulates the back-diffused signal to the original data according to a prescribed demodulation system, and the output terminal OT outputs the demodulated data.

As hereinabove described, the conventional disturbance wave eliminator applies the dc magnetic field H having constant strength to the magnetostatic wave filter 103 for implementing a prescribed pass band, i.e., the pass band P1 including the frequency range of the diffusion signal a1. When the operating temperature of the magnetostatic wave filter 103 changes due to change of external environment or heat generation in the disturbance wave eliminator itself, however, the pass band of the magnetostatic wave filter 103 drifts due to this temperature change.

FIGS. 24(*a*) and 24(*b*) are diagrams for illustrating a drifting state of the pass band caused when the temperature shifts to a higher side in the conventional disturbance wave eliminator shown in FIG. 22.

When the external temperature is increased to increase the operating temperature of the magnetostatic wave filter 103, for example, saturation magnetization of the YIG film 100 changes to change the optimum operating magnetic field. Consequently, the pass band P1 shown in FIGS. 23(*a*) and 23(*b*) drifts to a high-frequency side, to become a pass band P2 shown in FIGS. 24(*a*) and 24(*b*). When the magnetostatic wave filter 103 filters the diffusion signal a1 in this state, a low-frequency side signal component of the diffusion signal a1 is attenuated to form a diffusion signal a2', resulting in disappearance of a signal component in a part a, as shown in FIG. 24(*b*). When the data is demodulated by back-diffusing the diffusion signal a2' losing a partial signal component, an error occurs to remarkably deteriorate communication quality.

SUMMARY OF THE INVENTION

An object of the present invention is to provide a magnetostatic wave device capable of enlarging a pass bandwidth and flattening frequency characteristics in the pass band without increasing insertion loss.

Another object of the present invention is to provide a magnetostatic wave device, capable of enlarging a pass bandwidth and flattening frequency characteristics in the pass band without increasing insertion loss, which can be readily manufactured.

Still another object of the present invention is to provide a magnetostatic wave device capable of improving the degree of suppression without increasing insertion loss.

A further object of the present invention is to provide a magnetostatic wave device and a disturbance wave eliminator capable of correcting drift of a filtering band resulting from temperature change or the like.

A magnetostatic wave device according to an aspect of the present invention comprises a magnetic layer, having first and second end surfaces, made of a magnetostatic wave material, while a magnetostatic wave propagates between the first end surface and the second end surface in the magnetic layer, and the second end surface has a first part having a first interval with respect to the first end surface and a second part having a second interval different from the first interval with respect to the first end surface.

In the magnetostatic wave device according to this aspect of the present invention, the magnetostatic wave is propagated between the first and second end surfaces of the magnetic layer, while the first part of the second end surface has the first interval with respect to the first end surface and the second part has the second interval different from the first interval with respect to the first end surface. In other words, the magnetic layer is provided therein with two intervals, i.e., the first and second intervals, for propagating the magnetostatic wave, for selectively reflecting a magnetostatic wave having a wavelength twice the first interval between the first end surface and the first part of the second end surface and selectively reflecting a magnetostatic wave having a wavelength twice the second interval between the first end surface and the second part of the second end surface.

Therefore, the range of wavelengths of selectively reflectable magnetostatic waves is so enlarged that the pass bandwidth of the magnetostatic wave device can be enlarged without increasing insertion loss. The first and second intervals of the magnetic layer are different from each other not to abruptly change impedance with respect to the magnetostatic wave between the magnetic layer and the space around the same, whereby impedance matching between the magnetic layer and the space around the same is so improved that the frequency characteristics in the pass band can be flattened. Consequently, the pass bandwidth can be enlarged and the frequency characteristics in the pass band can be flattened without increasing insertion loss.

The first part preferably includes a first end surface part arranged in parallel with the first end surface at the first interval, and the second part preferably includes a second end surface part arranged in parallel with the first end surface at the second interval.

In this case, the first end surface part is arranged in parallel with the first end surface at the first interval and the second end surface is arranged in parallel with the first end surface at the second interval, so that the magnetostatic wave device can more selectively reflect the magnetostatic wave between the parallel end surfaces.

The magnetostatic wave device is preferably a resonator resonating the magnetostatic wave between the first and second end surfaces.

In this case, the magnetostatic wave device selectively resonating the magnetostatic wave between the first and second end surfaces can implement a resonator capable of enlarging the pass bandwidth and flattening the frequency characteristics in the pass band without increasing insertion loss.

The magnetic layer preferably includes first and second magnetic layers arranged at a prescribed interval in a direction intersecting with the first and second end surfaces.

In this case, the magnetic layer is formed by the first and second magnetic layers arranged at the prescribed interval and the first and second intervals of each magnetic layer are different from each other not to abruptly change impedance for the magnetostatic wave between the respective magnetic layers and a space therebetween, whereby the impedance matching between the magnetic layers and the space therebetween is so improved that the frequency characteristics in the pass band can be more flattened.

The magnetostatic wave device preferably further comprises an input line arranged on one of the first and second magnetic layers and an output line arranged on the other one of the first and second magnetic layers.

In this case, the input line is arranged on one of the magnetic layers and the output line is arranged on the other magnetic layer so that the input and output lines and the magnetic layers are in close contact with each other and loss between the input and output lines and the magnetic layers can be reduced for further reducing insertion loss.

A magnetostatic wave device according to another aspect of the present invention comprises a magnetic layer, having first and second end surfaces, made of a magnetostatic wave material in which a magnetostatic wave propagates, while the magnetic layer is separated into a plurality of magnetic layers by at least one groove formed between the first and second end surfaces and the groove has a stepwise section having at least one step.

In the magnetostatic wave device according to this aspect of the present invention, the groove formed between the first and second end surfaces separates the magnetic layer into a magnetic layer having the first end surface and an end surface formed by one side surface of the groove and another magnetic layer having the second end surface and an end surface formed by the other side surface of the groove and the groove has the sectional shape having at least one step, whereby at least one of the magnetic layers has different intervals between the end surfaces so that a resonator formed by coupling a plurality of resonators including a resonator resonating a magnetostatic wave between end surfaces having different intervals with each other can be prepared.

Therefore, at least one of the magnetic layers has different intervals for propagating magnetostatic waves, so that the magnetostatic wave device can selectively resonate a plurality of magnetostatic waves having different wavelengths. Consequently, the range of wavelengths of selectively reasonable magnetostatic waves is enlarged so that the pass bandwidth of the magnetostatic wave device can be enlarged without increasing insertion loss.

The groove has the stepwise section, whereby impedance with respect to the magnetostatic wave is not abruptly changed between the magnetic layers and the groove but impedance matching between the magnetic layers and the groove is so improved that the frequency characteristics in the pass band can be flattened.

Further, the aforementioned resonator can be prepared by forming at least one groove, whereby the resonator is easy to manufacture.

Consequently, the pass bandwidth can be enlarged and the frequency characteristics in the pass band can be flattened without increasing insertion loss, and the magnetostatic wave device can be readily manufactured.

The sectional shape of the groove is preferably deepest at the center of the groove and mirror-symmetrical. In this case, the sectional shape of the groove is deepest at the center of the groove and mirror-symmetrical, whereby end surfaces having different intervals with respect to the first and second end surfaces can be readily formed on each magnetic layer, for further enlarging the pass bandwidth and flattening the frequency characteristics in the pass band.

The groove is preferably formed by machining. In this case, the groove can be formed by machining such as grinding or polishing, whereby a substantially rectangular deep groove can be precisely formed on an arbitrary position of the magnetic layer with no influence by the crystallinity of the magnetic layer or the like as compared with chemical etching or ion milling.

A magnetostatic wave device according to still another aspect of the present invention comprises a magnetic layer, made of a magnetostatic wave material in which a magnetostatic wave propagates, receiving a dc magnetic field applied along a prescribed direction and first and second ferromagnetic layers provided on both ends of the magnetic layer in the direction of application of the dc magnetic field.

In the magnetostatic wave device according to this aspect of the present invention, the dc magnetic field is applied to the magnetic layer made of the magnetostatic wave material propagating a magnetostatic wave along the prescribed direction, and the first and second ferromagnetic layers are provided on both ends of the magnetic layer in the direction of application of the dc magnetic field. Therefore, the magnetic bias effect of the first and second ferromagnetic layers homogenizes the dc magnetic field, which in turn more homogeneously magnetizes the magnetic layer. Consequently, the magnetic layer can efficiently propagate a magnetostatic wave of a dominant mode while suppressing propagation of magnetostatic waves of other modes for reducing interference exerted on the dominant mode by other modes, whereby the degree of suppression can be increased without increasing insertion loss.

The first and second ferromagnetic layers are preferably formed on the main surface of the magnetic layer. In this case, the first and second ferromagnetic layers can be brought into close contact with the magnetic layer, whereby the magnetic bias effect of the first and second ferromagnetic layers can efficiently act on the magnetic layer for further improving homogeneity of magnetization in the magnetic layer.

Opposite ends of the first and second ferromagnetic layers are preferably not parallel to each other. In this case, parts of the magnetic layer along the ends of the first and second ferromagnetic layers define reflection interfaces, which are not parallel to each other since the opposite ends of the first and second ferromagnetic layers are not parallel to each other, for reflecting magnetostatic waves of other modes propagating through the magnetic layer to a direction between the first and second ferromagnetic layers. Thus, resonance of the magnetostatic waves of other modes propagating through the magnetic layer can be suppressed to the direction between the first and second ferromagnetic layers, whereby interference exerted on the dominant mode by other modes can be sufficiently reduced for further improving the degree of suppression as well as insertion loss.

The first and second ferromagnetic layers are preferably made of a hard magnetic material. In this case, the quantity of spins not contributing to resonance of the dominant mode in the magnetic layer can be reduced, whereby the magnetic bias effect of the first and second ferromagnetic layers can be more improved for further improving the degree of suppression as well as insertion loss.

The magnetic layer preferably has first and second end surfaces parallel to each other, and the magnetostatic wave device is preferably a resonator resonating a magnetostatic wave between the first and second end surfaces.

In this case, a magnetostatic wave of a dominant mode propagating between the first and second end surfaces can be efficiently resonated between the first and second end surfaces while resonance of magnetostatic waves of other modes can be suppressed for reducing influence exerted on the dominant mode by other modes, whereby a resonator improved in degree of suppression can be implemented without increasing insertion loss.

The magnetic layer preferably includes a plurality of magnetic layers, the plurality of magnetic layers are preferably so arranged that first and second end surfaces of magnetic layers adjacent to each other at a prescribed interval are parallel to each other, and the first and second ferromagnetic layers are preferably provided on each of the plurality of magnetic layers.

In this case, the plurality of magnetic layers can form resonators respectively so that the plurality of resonators can be coupled with each other, whereby the pass bandwidth can be enlarged.

A magnetostatic wave device according to a further aspect of the present invention comprises a magnetic body made of a magnetostatic wave material in which a magnetostatic wave propagates, a dc magnetic field applier applying a dc magnetic field to the magnetic body and an auxiliary magnetic field applier applying an auxiliary magnetic field having adjustable field strength to the magnetic body in addition to the dc magnetic field applied by the dc magnetic field applier.

In the magnetostatic wave device according to this aspect of the present invention, the auxiliary magnetic field applier having adjustable field strength applies the auxiliary magnetic field to the magnetic body in addition to the dc magnetic field applied by the dc magnetic field applier. When saturation magnetization of the magnetic body is changed by temperature change or the like to change the optimum operating magnetic field as well as the filtering band of the magnetostatic wave device, therefore, the auxiliary magnetic field applier can adjust the strength of the auxiliary magnetic field for optimally setting the magnetic field applied to the magnetic body, whereby drift of the filtering band resulting from temperature change or the like can be corrected.

The auxiliary magnetic field applier preferably includes an electromagnet generating a magnetic field by feeding a current to a coil.

In this case, the strength of a magnetic field generated from the electromagnet can be precisely adjusted by applying a current to the coil of the electromagnet and controlling the value of this current, whereby the auxiliary magnetic field can be applied with desired field strength by the simple method of controlling the value of the current fed to the coil, and drift of the filtering band resulting from temperature change or the like can be precisely corrected.

The auxiliary magnetic field applier may include an auxiliary magnetic field application film generating a magnetic field when fed with a current.

In this case, the strength of the magnetic field generated from the auxiliary magnetic field application film can be precisely adjusted by applying a current to the auxiliary magnetic field application film and controlling the value of this current, whereby the strength of the auxiliary magnetic field can be optimally adjusted by the simple method of controlling the value of the current fed to the auxiliary magnetic field application film. Further, the auxiliary magnetic field can be applied by the simple structure employing the auxiliary magnetic field application film, whereby the device can be miniaturized.

The magnetostatic wave device preferably further comprises a substrate having the magnetic body arranged on its main surface, and the auxiliary magnetic field application film and the magnetic body are preferably arranged to hold the substrate therebetween.

In this case, a magnetic body having excellent characteristics as a magnetostatic wave medium can be readily formed on the substrate while the auxiliary magnetic field application film is arranged oppositely to the magnetic body through the substrate, whereby an input antenna electrode and an output antenna electrode can be readily formed on the main surface of the magnetic body with no influence exerted by the auxiliary magnetic field application film. Further, the substrate is held between the auxiliary magnetic field application film and the magnetic body, whereby heat generated by energization of the auxiliary magnetic field application film can be prevented from direct conduction to the magnetic body and influence by heat generation of the auxiliary magnetic field application film can be suppressed.

A disturbance wave eliminator according to a further aspect of the present invention, eliminating a disturbance wave from an input signal, comprises a magnetostatic wave device including a magnetic body made of a magnetostatic wave material in which a magnetostatic wave propagates, a dc magnetic field applier applying a dc magnetic field to the magnetic body and an auxiliary magnetic field applier applying an auxiliary magnetic field having adjustable field strength to the magnetic body in addition to the dc magnetic field applied by the dc magnetic field applier and a control unit controlling the strength of the auxiliary magnetic field generated from the auxiliary magnetic field applier, while the magnetostatic wave device is a magnetostatic wave filter having a prescribed filtering band and the control unit includes a detector detecting change of the filtering band of the magnetostatic wave filter and a current controller controlling the value of a current supplied to the auxiliary magnetic field applier in response to the change of the filtering band detected by the detector.

The disturbance wave eliminator according to this aspect of the present invention detects change of the filtering band of the magnetostatic wave filter and controls the value of the current fed to the auxiliary magnetic field applier in response to the detected change of the filtering band. When the filtering band of the magnetostatic wave filter is changed by temperature change or the like, therefore, the auxiliary magnetic field applier can adjust the strength of the auxiliary magnetic field in response to the change of the filtering band for optimally setting the magnetic field applied to the magnetic body, whereby drift of the filtering band resulting from temperature change or the like can be corrected. Consequently, the filtering band of the magnetostatic wave filter can be regularly set in a proper range, whereby communication quality can be regularly kept excellent.

The detector preferably includes an insertion loss detector detecting change of insertion loss of the magnetostatic wave filter.

When the filtering band of the magnetostatic wave filter changes, the insertion loss also changes in response to the change of the filtering band, and hence the change of the filtering band resulting from temperature change or the like can be detected by detecting the change of the insertion loss.

The insertion loss detector preferably detects change of insertion loss on an edge of the filtering band of the magnetostatic wave filter.

In this case, the insertion loss detector detects change of the insertion loss on the edge remarkably changing the insertion loss when the filtering band changes, whereby the change of the filtering band can be detected with high sensitivity.

The insertion loss detector preferably detects change of insertion loss on high- and low-frequency side edge portions of the filtering band of the magnetostatic wave filter.

In this case, the insertion loss detector detects change of the insertion loss on the high- and low-frequency side edge portions of the filtering band of the magnetostatic wave filter, whereby change of the filtering band can be detected also when ripple or the like is caused on either the high- or low-frequency side of the filtering band, for reliably detecting change of the filtering band.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a schematic sectional view of the magnetostatic wave device shown in FIG. 1;

FIG. 17 is a sectional view taken along the line D–D' in FIG. 16;

DESCRIPTION OF THE PREFERRED EMBODIMENTS

Figure 1:
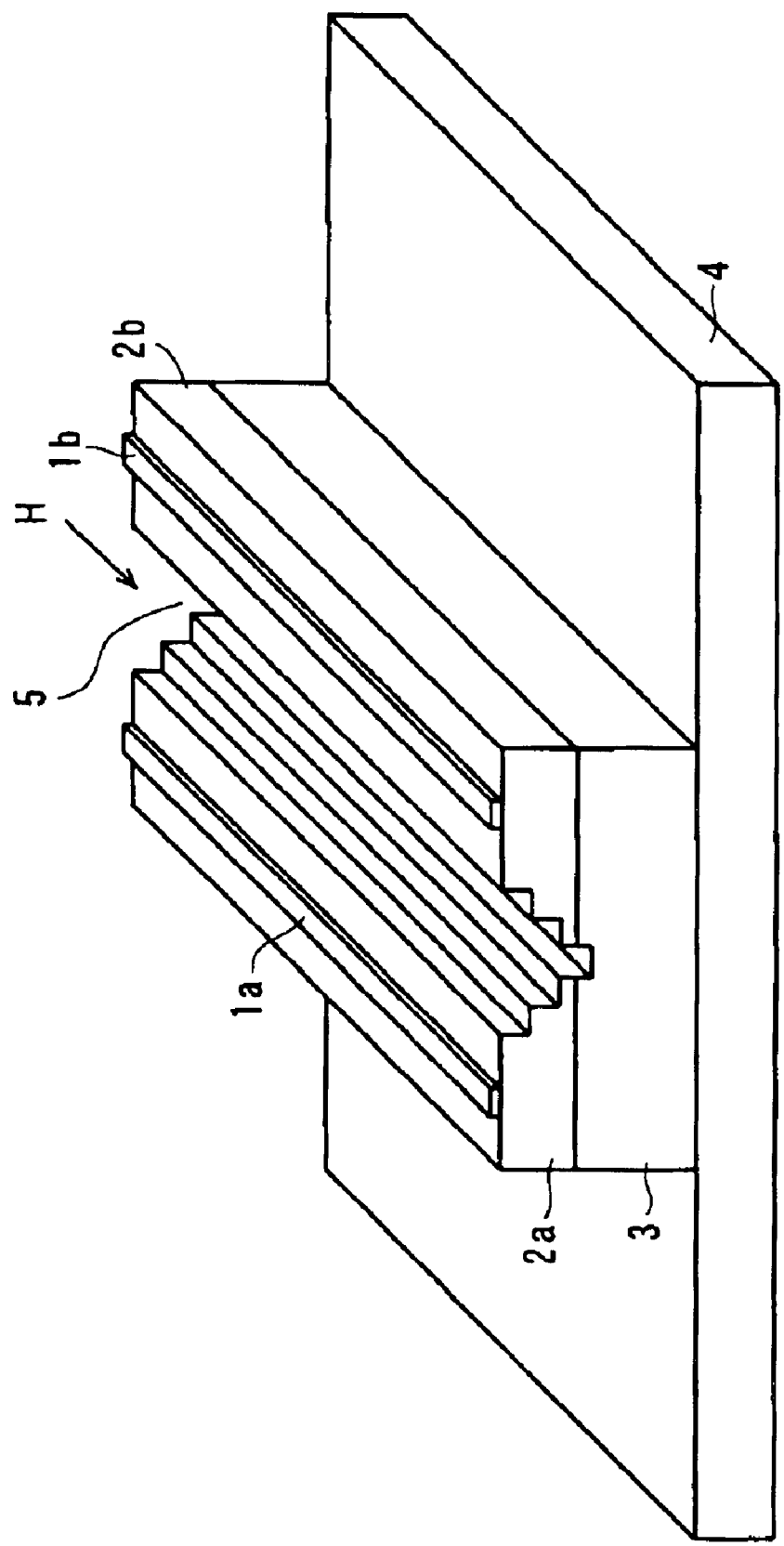
FIG. 1 is a schematic perspective view showing the structure of a magnetostatic wave device according to a first embodiment of the present invention.

A magnetostatic wave device according to a first embodiment of the present invention is now described with reference to the drawings. FIG. 1 is a schematic perspective view showing the structure of the magnetostatic wave device according to the first embodiment of the present invention.

The magnetostatic wave device shown in FIG. 1 comprises an input electrode 1$a$, an output electrode 1$b$, two YIG (yttrium-iron-garnet) films 2$a$ and 2$b$, a GGG (gadolinium-gallium-garnet) substrate 3 and a grounded substrate 4.

As shown in FIG. 1, the GGG substrate 3 is arranged on the grounded substrate 4, the YIG films 2$a$ and 2$b$ are arranged on the GGG substrate 3, the input electrode 1$a$ is arranged on the YIG film 2$a$ and the output electrode 1$b$ is arranged on the YIG film 2$b$. A magnetic field generator (not shown) formed by a permanent magnet or an electromagnet applies a dc magnetic field H to the YIG films 2$a$ and 2$b$ along the longitudinal direction of the YIG films 2$a$ and 2$b$.

The input electrode 1$a$ and the output electrode 1$b$ are made of a metal having excellent conductivity such as Al, Cu, Au or Ag, for example, and the sectional shapes thereof are not particularly restricted to quadrangular shapes shown in FIG. 1 but may be other forms such as circular forms.

The YIG films 2$a$ and 2$b$, which are magnetic layers made of a ferrimagnetic substance, can be formed by $Y_3Fe_5O_{12}$ single-crystalline films, which are magnetic garnet single-crystalline films grown on the surface of the GGG substrate 3 by liquid phase epitaxy, for example. The magnetic layers are not particularly restricted but another magnetostatic wave material may alternatively be employed so far as the same can propagate a magnetostatic wave.

According to this embodiment, the YIG films 2$a$ and 2$b$ have rectangular shapes with a width of about 2 mm, a length of 5 mm and a thickness of 25 $\mu$m, and are separated from each other on the GGG substrate 3 by a groove 5 formed by machining as described later so that longitudinal end surfaces 20$a$ and 21$a$ thereof are parallel to each other. In this case, the GGG substrate 3 has a width of 4.5 mm, a length of 5 mm and a thickness of 400 $\mu$m.

The sectional shape of the groove 5 of the magnetostatic wave device having the aforementioned structure is now described. FIG. 2 is a schematic sectional view of the magnetostatic wave device shown in FIG. 1.

As shown in FIG. 2, the widths t1, t2 and t3 of the upper portion, the intermediate portion and the lower portion of the section of the groove 5 are 500 $\mu$m, 300 $\mu$m and 100 $\mu$m respectively, and the depths d1, d2 and d3 of the shallowest portion, the next-deepest portion and the deepest portion thereof are 10 $\mu$m, 20 $\mu$m and 30 $\mu$m respectively. Thus, the groove 5 exhibits a mirror-symmetrical sectional shape having the deepest central portion.

The YIG films 2$a$ and 2$b$ are 25 $\mu$m in thickness, and hence the central portion of the groove 5 is formed also on the GGG substrate 3 by a depth of 5 $\mu$m from the surface of the GGG substrate 3. Therefore, the YIG films 2$a$ and 2$b$ are completely separated from each other on the GGG substrate 3, and have the sectional shapes mirror-symmetrical about the groove 5. The groove 5 may have a depth sufficient for completely separating the YIG films 2$a$ and 2$b$ from each other. Therefore, the groove 5 may be of the same thickness as the YIG films 2$a$ and 2$b$, or may be more deeply formed in the GGG substrate 3.

Due to the groove 5 having the aforementioned sectional shape, the YIG film 2$a$ is formed with first to third end surfaces 20$b$ to 20$d$ in parallel with the longitudinal end surface 20$a$ respectively at distances of 100 $\mu$m. Therefore, the end surface 20$a$ and the first end surface 20$b$ form a straight edge resonator selectively resonating a magnetostatic wave having a wavelength twice a first interval between the end surface 20$a$ and the first end surface 20$b$ as a dominant mode, the end surface 20$a$ and the second end surface 20$c$ form a straight edge resonator selectively resonating a magnetostatic wave having a wavelength twice a second interval (the first interval +100 $\mu$m) between the end surface 20$a$ and the second end surface 20$c$ as a dominant mode, and the end surface 20$a$ and the third end surface 20$d$ form a straight edge resonator selectively resonating a magnetostatic wave having a wavelength twice a third interval (the first interval+200 $\mu$m) between the end surface 20$a$ and the third end surface 20$d$ as a dominant mode.

Due to the mirror-symmetrical section of the groove 5, further, the YIG film 2$b$ also forms straight edge resonators selectively resonating magnetostatic waves having wavelengths twice the first interval between the end surface 21$a$ and a first end surface 21$b$, the second interval between the end surface 21$a$ and a second end surface 21$c$ and the third interval between the end surface 21$a$ and a third end surface 21$d$ as dominant modes,t respectively.

The sectional shape of the groove 5 is not particularly restricted to the above example but another shape such as a tapered shape, a curved shape or a composite shape of the tapered and curved shapes may be employed so far as end surfaces forming resonators have different intervals. While each surface is linearly formed along the longitudinal direction of the YIG film 2$a$ or 2$b$, the end surface may alternatively be formed in a stepwise shape, a tapered shape or a curved shape along the longitudinal direction.

Operations of the magnetostatic wave device having the aforementioned structure is now described. When externally receiving an input signal, the input electrode 1$a$ generates a high-frequency magnetic field corresponding to the input signal. At this time, the dc magnetic field H is applied along the longitudinal direction of the YIG film 2a, for inducing a magnetostatic surface wave in the YIG film 2a by the high-frequency magnetic field generated from the input electrode 1a.

In the magnetostatic surface wave induced in the YIG film 2a, a magnetostatic wave having the wavelength twice the first interval between the end surface 20a and the first end surface 20b is selectively reflected between the end surface 20a and the first end surface 20b, to selectively resonate in this dominant mode.

In the induced magnetostatic surface wave, further, a magnetostatic wave having the wavelength twice the second interval between the end surface 20a and the second end surface 20c is selectively reflected between the end surface 20a and the second end surface 20c, to selectively resonate in this dominant mode.

In the induced magnetostatic surface wave, in addition, a magnetostatic wave having the wavelength twice the third interval between the end surface 20a and the third end surface 20d is selectively reflected between the end surface 20a and the third end surface 20d, to selectively resonate in this dominant mode.

Thus, the YIG film 2a can selectively resonate three magnetostatic waves having different wavelengths and efficiently propagate these magnetostatic waves therein.

The first to third end surfaces 20b to 20d of the YIG film 2a and the first to third end surfaces 21b to 21d of the YIG film 2b are arranged in parallel with each other through the groove 5, and the YIG films 2a and 2b are coupled with each other as resonators. The first to third intervals between the end surfaces 20b to 20d and 21b to 21d the YIG films 2a and 2b are gradually changed and hence impedance with respect to the magnetostatic waves is not abruptly changed between the YIG films 2a and 2b and the groove 5 (space, air in this embodiment) therebetween but impedance matching between the YIG films 2a and 2b and the groove 5 is improved. Consequently, the magnetostatic waves having the wavelengths twice the first to third intervals can be efficiently propagated from the YIG film 2a to the YIG film 2b through the groove 5.

The YIG film 2b, also provided with the first to third end surfaces 21b to 21d with respect to the end surface 21a similarly to the YIG film 2a, can selectively resonate the magnetostatic waves having the wavelengths twice the first to third intervals between the end surface 21a and the first to third end surfaces 21b to 21d and efficiently propagate only the magnetostatic waves of the dominant modes between the longitudinally parallel end surfaces 21b to 21d of the YIG film 2b, efficiently propagating the three magnetostatic waves having different wavelengths therein.

Thus, the YIG films 2a and 2b operate as resonators respectively while the impedance matching between the YIG films 2a and 2b and the groove 5 is improved and the resonators are coupled with each other with small loss, so that the magnetostatic waves of the dominant modes of the resonators can be more efficiently propagated. The output electrode 1b converts the efficiently propagated magnetostatic waves to an electric signal, which in turn is taken out as an output signal. Consequently, a resonator capable of enlarging pass bandwidth and flattening frequency characteristics in the pass band without increasing insertion loss can be implemented.

Figure 3:
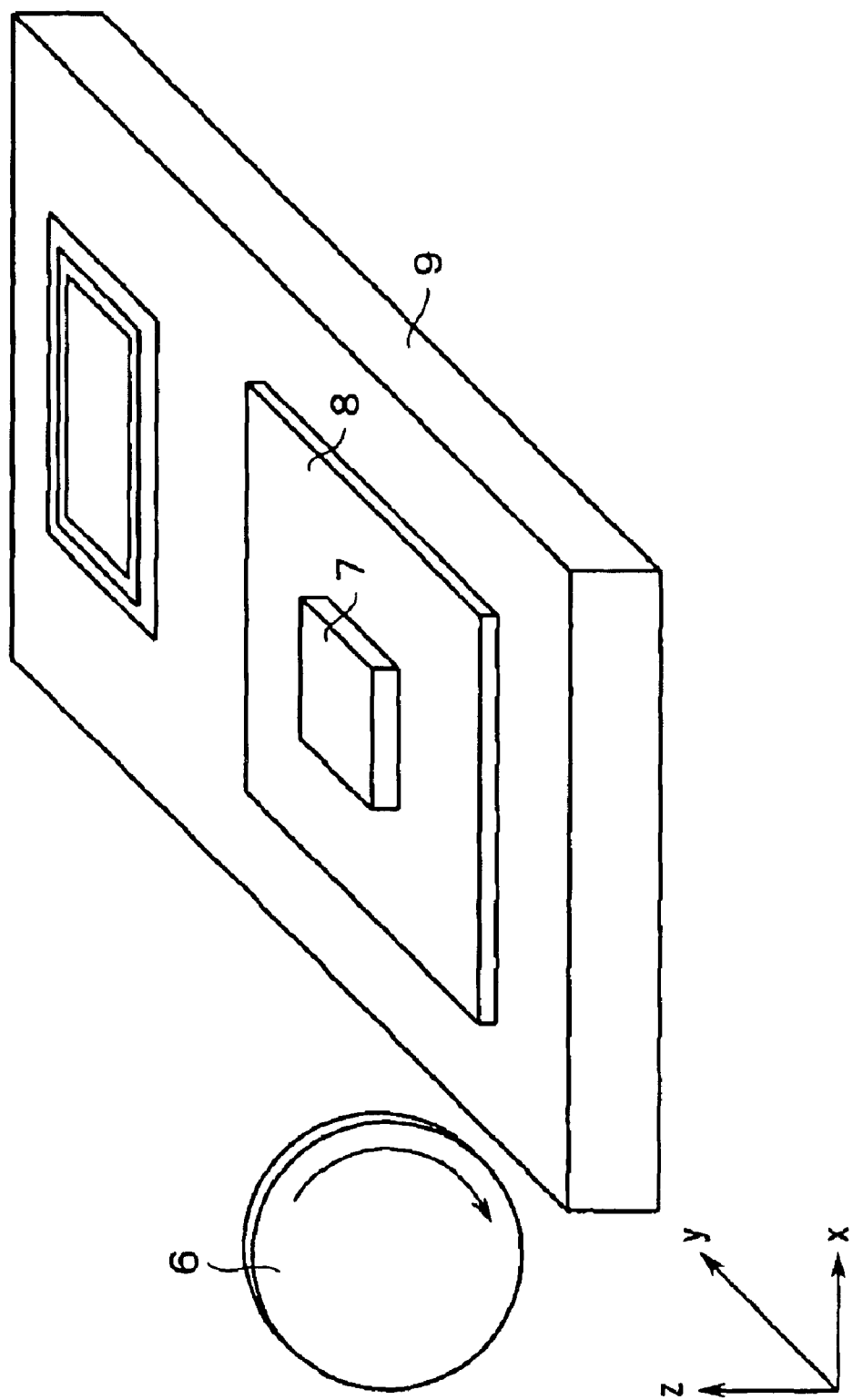
FIG. 3 is a schematic perspective view for illustrating a method of forming a groove in a YIG film shown in FIG. 1 by machining.

In a method of manufacturing the magnetostatic wave device having the aforementioned structure, a method of forming the groove 5 is now described. FIG. 3 is a schematic perspective view for illustrating the method of forming the groove 5 between the YIG films 2a and 2b shown in FIG. 1 by machining.

A blade 6 shown in FIG. 3 is a disc blade formed to be rotatable about a y-axis in FIG. 3 and movable in parallel with a z-axis in FIG. 3 in a dicing saw and provided with a forward cutting edge having a rectangular shape capable of forming a rectangular groove. A stage 9 is formed to be movable in parallel with the x-axis and the y-axis in FIG. 3 in the dicing saw respectively, and has a vacuum chucking function.

The blade 6 can be formed by a diamond blade prepared by electrodeposition, for example, with diamond grains of 3 μm in mean grain size, for example, with a diamond grain filling factor of 50% and a thickness of 100 μm. The blade 6 is not particularly restricted to the aforementioned example but may be formed by a blade prepared by powder metallurgy or the like or prepared by solidifying abrasive grains with thermosetting resin or the like.

First, the blade 6 is mounted on the dicing saw, a workpiece 7 is fixed onto a carbon base 8 with wax, and the carbon base 8 is fixed onto the stage 9 of the dicing saw by vacuum chucking. The workpiece 7 is prepared by forming a YIG film of 25 μm in thickness on the GGG substrate 3 of 4.5 mm in length, 5 mm in width and 400 μm in thickness by epitaxial growth.

Then, the blade 6 is rotated along arrow in FIG. 3 at a rotational frequency of 3000 rpm and moved in the −z direction to be fixed to a prescribed position, while the stage 9 is moved in the −x direction for forming a striped groove of 10 μm in depth on the YIG film forming the workpiece 7.

Then, the stage 9 is moved in the y direction by 400 μm, and thereafter moved in the −x direction while fixing the blade 6 on the prescribed position similarly to the above for forming another striped groove of 10 μm in depth on the YIG film forming the workpiece 7 in parallel with the already formed groove at a space of 300 μm.

Then, the blade 6 is moved in the z direction and the stage 9 is moved in the −y direction by 300 μm, while the blade 6 is thereafter further moved in the −z direction by 10 μm and the stage 9 is moved in the −x direction for forming still another striped groove of 20 μm in depth on the YIG film forming the workpiece 7.

Then, the stage 9 is moved in the y direction by 200 μm, and thereafter moved in the −x direction while fixing the blade 6 on the prescribed position similarly to the above, for forming a further striped groove of 20 μm in depth in the YIG film forming the workpiece 7 in parallel with the already formed groove of 20 μm in depth at a space of 100 μm.

Then, the blade 6 is moved in the z direction, the stage 9 is moved in the −y direction by 100 μm, thereafter the blade 6 is moved in the −z direction by 10 μm and the stage 9 is moved in the −x direction for forming a further striped groove of 30 μm in depth on the YIG film forming the workpiece 7 and the GGG substrate 3, thereby forming the two YIG films 2a and 2b separated by the groove 5 on the GGG substrate 3 as shown in FIG. 1.

Thereafter the input electrode 1a and the output electrode 1b are formed on the YIG films 2a and 2b by vapor deposition through a mask respectively, thereby preparing the magnetostatic wave device comprising the groove 5 having a three-staged shape having the steps of 10 μm and the maximum groove width of 500 μm as shown in FIG. 1.

According to this embodiment, as hereinabove described, the groove 5 is formed by machining so that a striped groove having a desired sectional shape as well as desired groove widths and desired groove depths can be formed in a short time. According to this machining, a rectangular groove can be preciously prepared in a desired direction without depending on the crystallinity or the crystal direction of the YIG films 2a and 2b.

The order of forming the groove is not particularly restricted to the aforementioned example but may be modified in various manners. For example, the groove may be successively formed from either side or the central side, or a plurality of different blades having different widths may be employed for working the shallowest portion of the groove at once with a blade of 500 μm in width, working the next-deepest groove portion at once with a blade of 300 μm in width and finally working the deepest groove portion with a blade of 100 μm in width.

Figure 4:
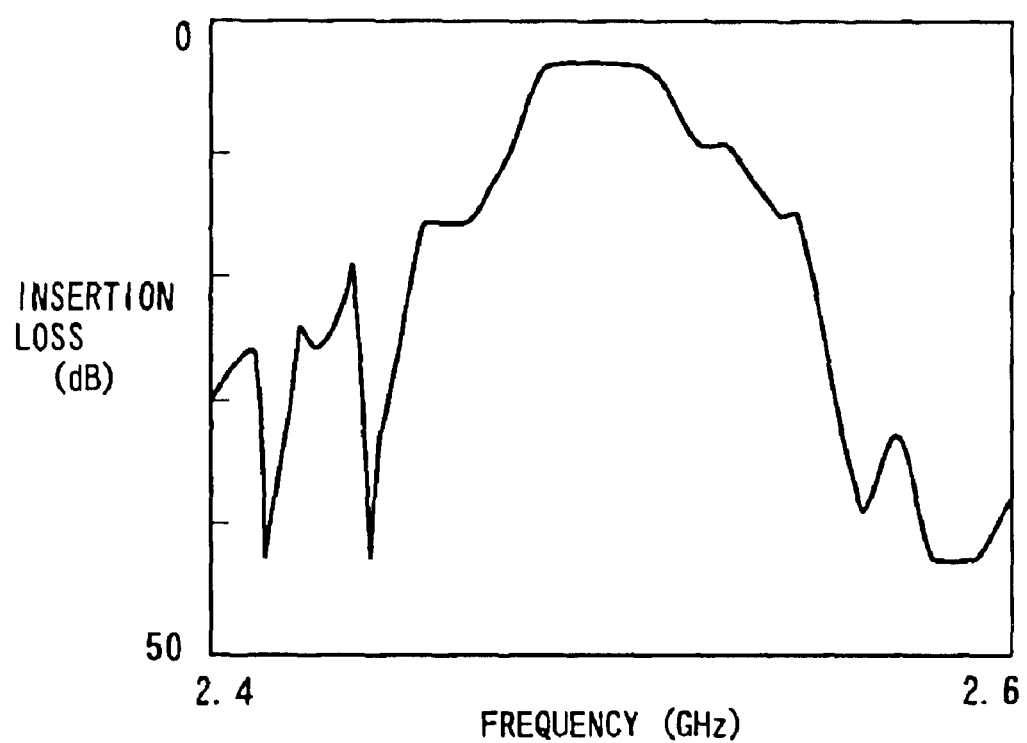
FIG. 4 illustrates the frequency characteristics of the magnetostatic wave device shown in FIG. 1.

The frequency characteristics of the magnetostatic wave device shown in FIG. 1 prepared by the aforementioned method are now described. FIG. 4 illustrates the frequency characteristics of the magnetostatic wave device shown in FIG. 1. The field strength of the dc magnetic field H employed for measuring the frequency characteristics of the prepared magnetostatic wave element is $2.4 \times 10^4$ A/m.

As shown in FIG. 4, the insertion loss is reduced to 5.0 dB and the 3 dB bandwidth is enlarged to 40 MHz and flattened. Thus, the insertion loss can be reduced, the pass bandwidth can be enlarged and the frequency characteristics in the pass band can be flattened.

According to this embodiment, as hereinabove described, the groove 5 separates the YIG film into the YIG films 2a and 2b on the GGG substrate 3 while the groove 5 has the stepwise sectional shape, whereby the YIG films 2a and 2b having different intervals between end surfaces can be formed for enabling preparation of a resonator by coupling the two YIG films 2a and 2b resonating magnetostatic waves between the end surfaces.

Therefore, three intervals are provided in each of the YIG films 2a and 2b for propagating magnetostatic waves, thereby selectively resonating three magnetostatic waves having different wavelengths. Consequently, the range of the wavelengths of selectively resonated magnetostatic waves is enlarged so that the pass bandwidth of the magnetostatic wave device can be enlarged without increasing the insertion loss.

The groove 5 has the stepwise section, whereby the impedance with respect to the magnetostatic waves is not abruptly changed between the YIG films 2a and 2b and the groove 5 but impedance matching between the YIG films 2a and 2b and the groove 5 is improved so that the frequency characteristics in the pass band can be flattened. Further, the aforementioned resonator can be prepared by forming the single groove 5, whereby the resonator is easy to manufacture.

Thus, the magnetostatic wave device according to this embodiment can enlarge the pass bandwidth and flatten the frequency characteristics in the pass band without increasing the insertion loss, and can be readily manufactured.

As hereinabove described, the magnetostatic wave device according to this embodiment can operate as a resonator having small insertion loss, a wide pass bandwidth and flattened frequency characteristics in the pass band, and is preferably applicable to filtering. For example, the magnetostatic wave device can be suitably employed as a high-frequency filter for a disturbance wave eliminator employing a spread spectrum communication system such as the direct sequence system, the frequency hopping system or the like, applicable to the so-called cellular radio system such as a portable telephone of a local LAN (local area network) or the CDMA (code division multiple access) system.

While the groove 5 having the stepwise section is formed between the YIG films 2a and 2b for coupling two resonators with each other in the above description, a similar effect can be attained also when forming a single groove having a rectangular section between the YIG films 2a and 2b and forming stepwise end surfaces on the outer sides of the two YIG films 2a and 2b separated from each other. The number of the coupled resonators is not restricted to two but a single resonator may alternatively be employed so far as the intervals between end surfaces are different from each other in a YIG film forming at least one resonator, or three or more resonators may be coupled with each other.

While the dc magnetic field H is applied along the direction parallel to the input electrode 1a for employing the magnetostatic surface wave in this embodiment, the direction for applying the dc magnetic field H is not particularly restricted to this example but the dc magnetic field H may be applied along another direction for employing a magnetostatic backward volume wave or a magnetostatic forward volume wave. The field strength of the applied dc magnetic field H is not restricted to the above example either but may be modified in various ways.

Figure 5:
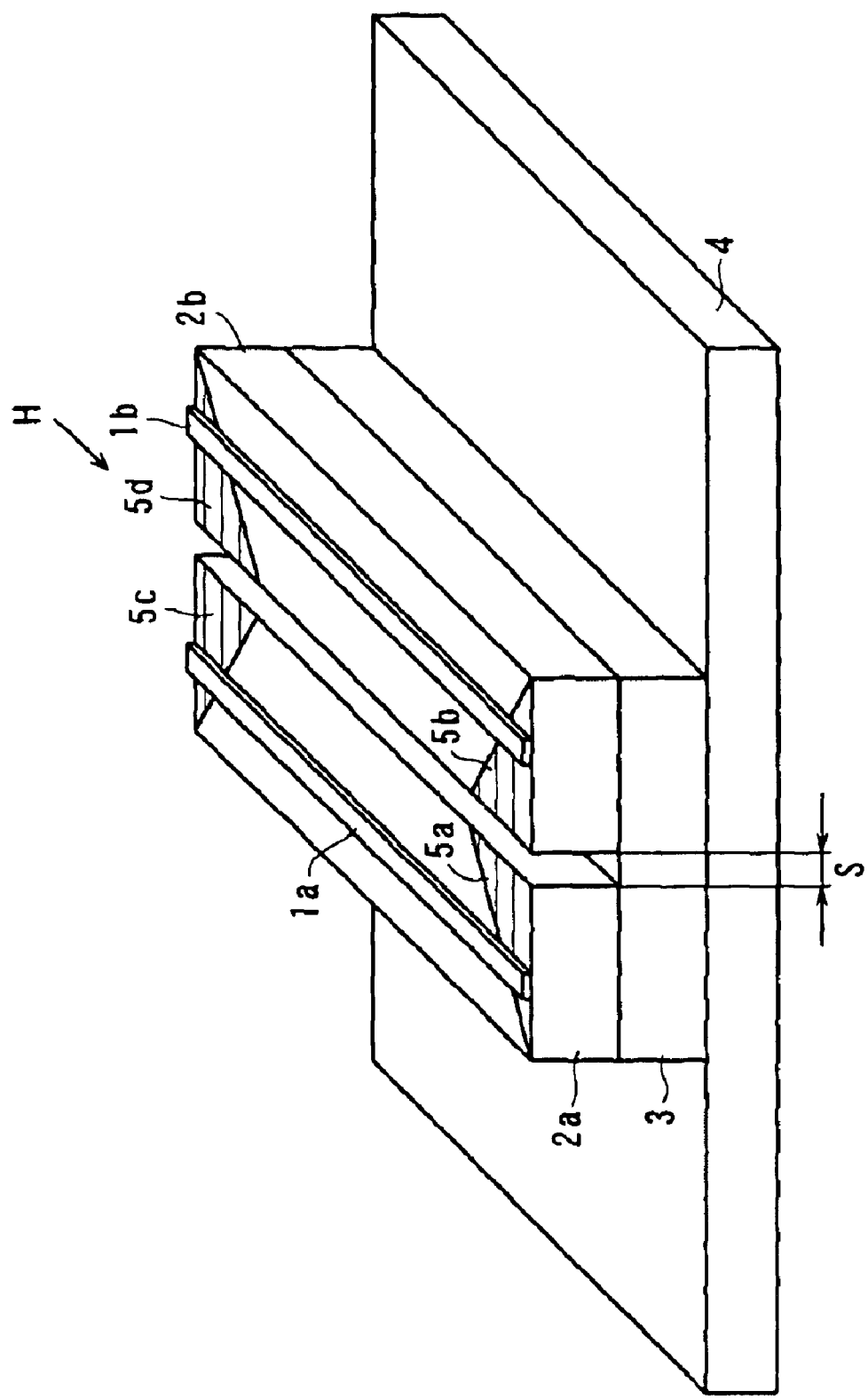
FIG. 5 is a schematic perspective view showing the structure of a magnetostatic wave device according to a second embodiment of the present invention.

A magnetostatic wave device according to a second embodiment of the present invention is now described with reference to the drawings. FIG. 5 is a schematic perspective view showing the structure of the magnetostatic wave device according to the second embodiment of the present invention.

The magnetostatic wave device shown in FIG. 5 comprises an input electrode 1a, an output electrode 1b, two YIG (yttrium-iron-garnet) films 2a and 2b, a GGG (gadolinium-gallium-garnet) substrate 3, a grounded substrate 4 and four ferromagnetic layers 5a to 5d.

As shown in FIG. 5, the GGG substrate 3 is arranged on the grounded substrate 4, the YIG films 2a and 2b are arranged on the GGG substrate 3, and the ferromagnetic layers 5a to 5d are arranged on the main surfaces (opposite to the GGG substrate 3) of the YIG films 2a and 2b on both ends along the longitudinal direction of the YIG films 2a and 2b respectively. The input electrode 1a is arranged on the YIG film 2a and the output electrode 1b is arranged on the YIG film 2b, so that a magnetic field generator (see FIG. 6) applies a dc magnetic field H to the YIG films 2a and 2b along the longitudinal direction thereof.

The input electrode 1a and the output electrode 1b are made of a metal having excellent conductivity such as Al, Cu, Au or Ag, for example, and the sectional shapes thereof are not particularly restricted to quadrangular shapes shown in FIG. 5 but may be other forms such as circular forms.

The YIG films 2a and 2b, which are magnetic layers made of a ferrimagnetic substance, can be formed by $Y_3Fe_5O_{12}$ single-crystalline films, which are magnetic garnet single-crystalline films grown on the surface of the GGG substrate 3 by liquid phase epitaxy, for example. The magnetic layers are not particularly restricted but another magnetostatic wave material may alternatively be employed so far as the same can propagate a magnetostatic wave.

According to this embodiment, the YIG films 2a and 2b have rectangular shapes of 2 mm in width, 5 mm in length and 25 μm in thickness, for example, and are so arranged that a space S between the YIG films 2a and 2b is 0.2 mm and longitudinal end surfaces thereof are parallel to each other. In other words, the longitudinal end surfaces of the YIG films 2a and 2b are parallel to each other, while the inner end surfaces of the YIG films 2a and 2b are also parallel to each other. In this case, the GGG substrate 3 is 4.2 mm in width, 5 mm in length and 400 µm in thickness.

The ferromagnetic layers 5a to 5d are made of a ferromagnetic substance such as CoPt, for example, in this embodiment, and have holding power of about 160 kA/m (about 2 kOe). The material for the ferromagnetic layers 5a to 5d is not particularly restricted to the above example but may be prepared from any ferromagnetic substance, while a hard magnetic substance is preferably employed for improving a magnetic bias effect described later.

The ferromagnetic layers 5a to 5d are arranged on both ends of the YIG films 2a and 2b in the direction of application of the dc magnetic field H. The arrangement of the ferromagnetic layers 5a to 5d is not restricted to that shown in FIG. 5 but the ferromagnetic layers 5a to 5d may be arranged on other positions so far as the same are on both ends of the YIG films 2a and 2b in the direction of application of the dc magnetic field H.

The ferromagnetic layers 5a to 5d have triangular shapes with a thickness of 0.1 µm. The shapes of the ferromagnetic layers 5a to 5d are not particularly restricted to the aforementioned triangular shapes but can be selected from various shapes. For example, the ferromagnetic layers 5a to 5d may have square, trapezoidal or quarter-circular shapes with a larger thickness, while the parts of the YIG films 2a and 2b located under the ferromagnetic layers 5a to 5d may be omitted for forming all portions from the upper surface of the GGG substrate 3 to the upper surfaces of the YIG substrates 2a and 2b by the ferromagnetic layers 5a to 5d.

In order to attenuate magnetostatic waves of other modes, however, the opposite ends of the ferromagnetic layers 5a and 5c and those of the ferromagnetic layers 5b and 5d are preferably not parallel to each other, as described later.

Figure 6:
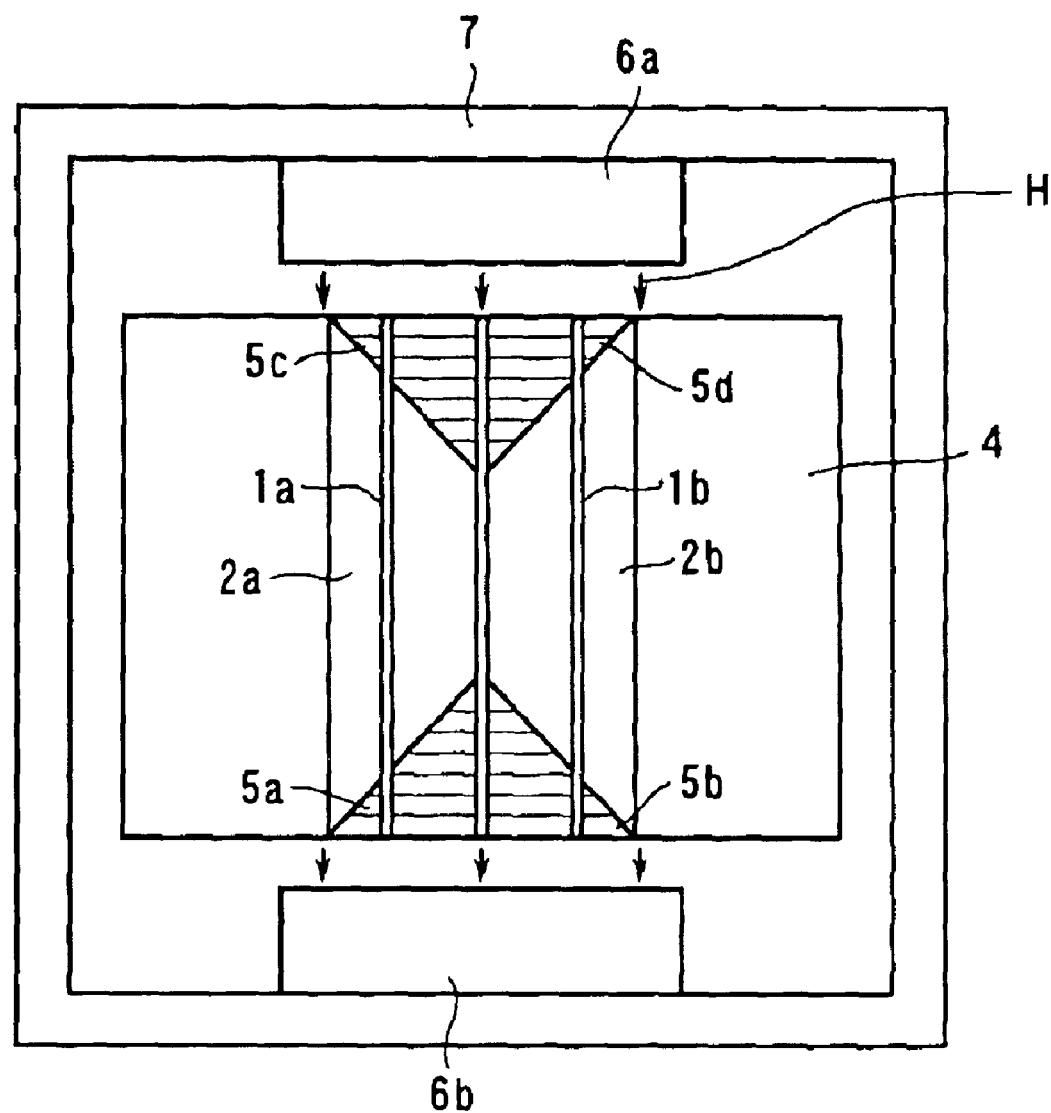
FIG. 6 is a plan view of the magnetostatic wave device and a magnetic field generator shown in FIG. 5.

A method of applying the dc magnetic field H to the magnetostatic wave device having the aforementioned structure is now described. FIG. 6 is a plan view of the magnetostatic wave device shown in FIG. 5 and the magnetic field generator.

As shown in FIG. 6, permanent magnets 6a and 6b are arranged on both longitudinal sides of the YIG films 2a and 2b of the magnetostatic wave device shown in FIG. 5, and these permanent magnets 6a and 6b are fixed to a yoke 7 for refluxing magnetic fluxes generated from the permanent magnets 6a and 6b and forming a closed circuit.

According to the aforementioned structure, the magnetic flux generated from the permanent magnet 6a is guided to the permanent magnet 6b through the YIG films 2a and 2b and refluxed in the yoke 7 for applying the dc magnetic field H along the longitudinal direction of the YIG films 2a and 2b, as shown by arrows in FIG. 6. The magnetic field generator generating the dc magnetic field H is not particularly restricted to that formed by the aforementioned permanent magnets 6a and 6b but another magnetic field generator such as that formed by electromagnets may be employed.

Operations of the magnetostatic wave device having the aforementioned structure are now described. When externally receiving an input signal, the input electrode 1a first generates a high-frequency magnetic field corresponding to this input signal. At this time, the dc magnetic field H is applied along the longitudinal direction of the YIG film 2a for inducing a magnetostatic surface wave in the YIG film 2a by the high-frequency magnetic field generated from the input electrode 1a, and this magnetostatic surface wave is propagated, reflected and resonated between the longitudinally parallel end surfaces of the YIG film 2a as the dominant mode.

At this time, the dc magnetic field H is homogenized due to the magnetic bias effect of the ferromagnetic layers 5a and 5b, for more homogeneously magnetizing the YIG film 2a by the dc magnetic field H. Consequently, the magnetostatic wave of the dominant mode can be effectively propagated in the YIG film 2a.

Also when the permanent magnets 6a and 6b are misregistered with respect to the longitudinal direction of the YIG film 2a and the direction of application of the dc magnetic field H deviates from the longitudinal direction of the YIG film 2a, the dc magnetic field H can be guided from the ferromagnetic layer 5b toward the ferromagnetic layer 5a, i.e., in the longitudinal direction of the YIG film 2a due to the magnetic bias effect of the ferromagnetic layers 5a and 5b. Thus, the alignment margin between the magnetic field generator and the magnetostatic wave device can be increased for more simplifying manufacturing steps.

Further, the opposite ends of the ferromagnetic layers 5a and 5b are not parallel to each other, whereby the portion of the YIG film 2a along these ends defines a reflecting interface for reflecting magnetostatic waves of other modes propagated along the longitudinal direction etc. of the YIG film 2a to directions different from the incidence direction and attenuating the same with no resonance. Thus, resonance of the magnetostatic waves of other modes propagated along the longitudinal direction of the YIG film 2a or the like can be so suppressed that interference of other modes on the dominant mode can be sufficiently reduced.

Thus, the YIG film 2a operates as a single straight edge resonator, which can efficiently propagate only the magnetostatic wave of the dominant mode between the longitudinally parallel end surfaces and efficiently resonating the magnetostatic wave of the dominant mode between these end surfaces.

The longitudinally parallel inner end surfaces of the YIG films 2a and 2b are arranged in parallel with each other through the space S, so that the YIG films 2a and 2b are coupled with each other as resonators and the magnetostatic wave is efficiently propagated from the YIG film 2a to the YIG film 2b.

The YIG film 2b, also provided with the ferromagnetic layers 5c and 5d similarly to the YIG film 2a, also operates as a single straight edge resonator, which can efficiently propagate only the magnetostatic wave of the dominant mode between the longitudinally parallel end surfaces and efficiently resonating the magnetostatic wave of the dominant mode between these end surfaces.

Thus, the YIG films 2a and 2b respectively operate as resonators, which are coupled with each other with low loss so that the magnetostatic waves of the dominant modes of these resonators can be more efficiently propagated. The output electrode 1b converts the magnetostatic wave propagated to the YIG film 2b to an electric signal, which is taken out as an output signal.

Figure 7:
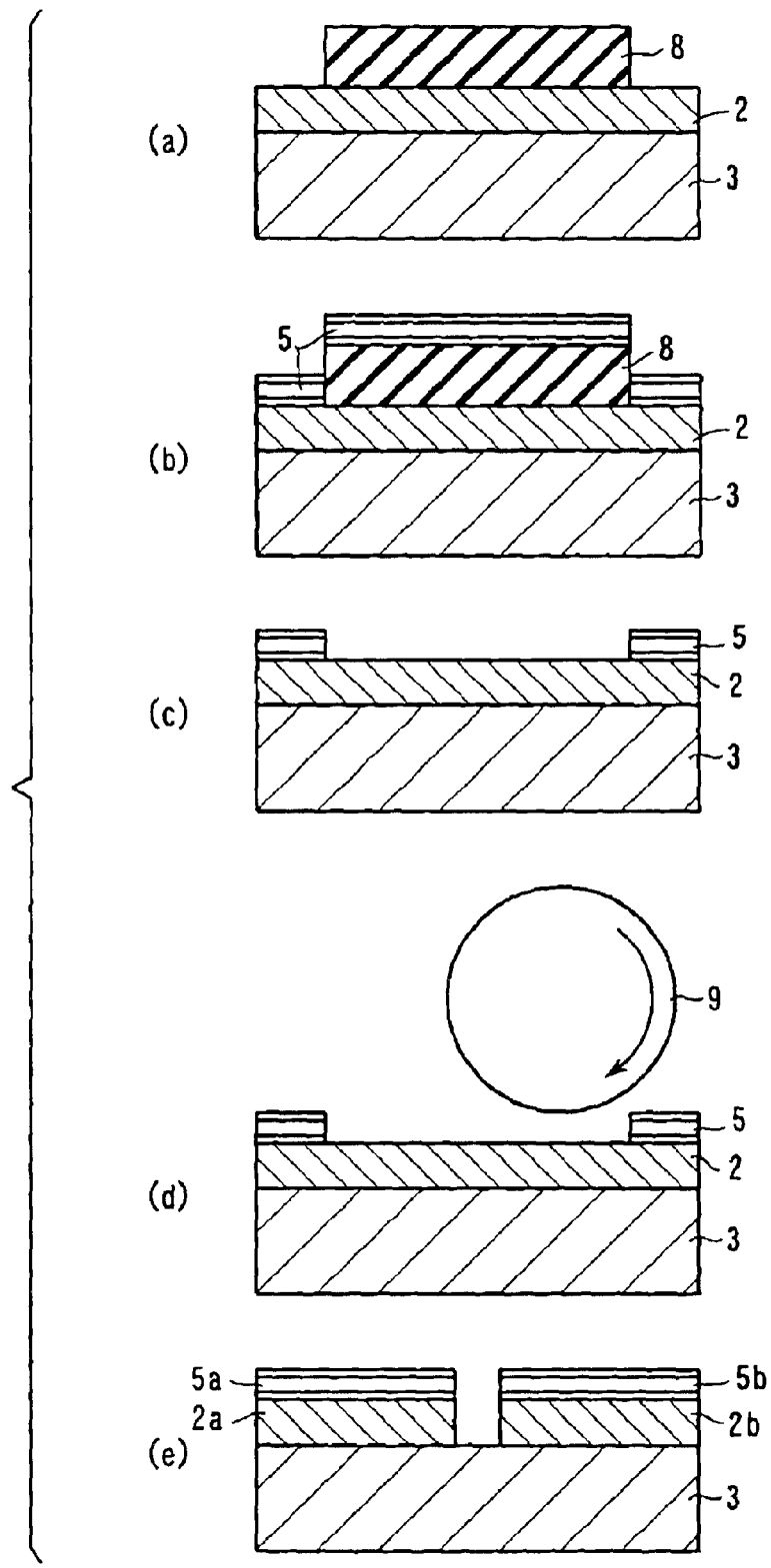
FIGS. 7(a) to 7(e) are schematic sectional views for illustrating a method of manufacturing the magnetostatic wave device shown in FIG. 5.

A method of manufacturing the aforementioned magnetostatic wave device is now described. FIGS. 7(a) to 7(e) are schematic sectional views for illustrating the method of manufacturing the magnetostatic wave device shown in FIG. 5. FIG. 7(e) shows the magnetostatic wave device as viewed from a direction rotated by 90° from that shown in FIGS. 7(a) to 7(d).

First, the GGG substrate 3 is prepared form forming the YIG film 2 thereon by liquid phase epitaxial growth, thereafter applying resist onto the YIG film 2 and performing exposure and development with an exposure apparatus such as an aligner through a mask having a desired pattern drawn thereon, thereby forming a resist layer 8 having the desired pattern, as shown in FIG. 7(a).

Then, ferromagnetic layers 5 of CoPt are formed on the YIG film 2 formed with the resist layer 8 by DC sputtering or the like to have a prescribed thickness, as shown in FIG. 7(b).

Then, the resist layer 8 is removed with a prescribed repellent while leaving the ferromagnetic layers 5 on both longitudinal ends of the YIG film 2, as shown in FIG. 7(c).

Then, a dicing saw is employed for longitudinally scanning the YIG film 2 with a blade 9 rotating along arrow in FIG. 7(d) thereby forming a groove, as shown in FIG. 7(d). Consequently, the two YIG films 2a and 2b are formed on the GGG substrate 3 while the ferromagnetic layers 5a and 5c are formed on both longitudinal ends of the YIG film 2a and the ferromagnetic layers 5b and 5d are formed on both longitudinal ends of the YIG film 2b respectively, as shown in FIG. 7(e).

Finally, the input electrode 1a and the output electrode 1b shown in FIG. 5 are formed on the YIG films 2a and 2b and the ferromagnetic layers 5a to 5d, for preparing the magnetostatic wave device shown in FIG. 5. The method of manufacturing the magnetostatic wave device according to this embodiment is not particularly restricted to the above example but may be modified in various ways, for forming a groove similar to the above by machining with a rotary disc blade in place of the dicing saw, for example.

Figure 8:
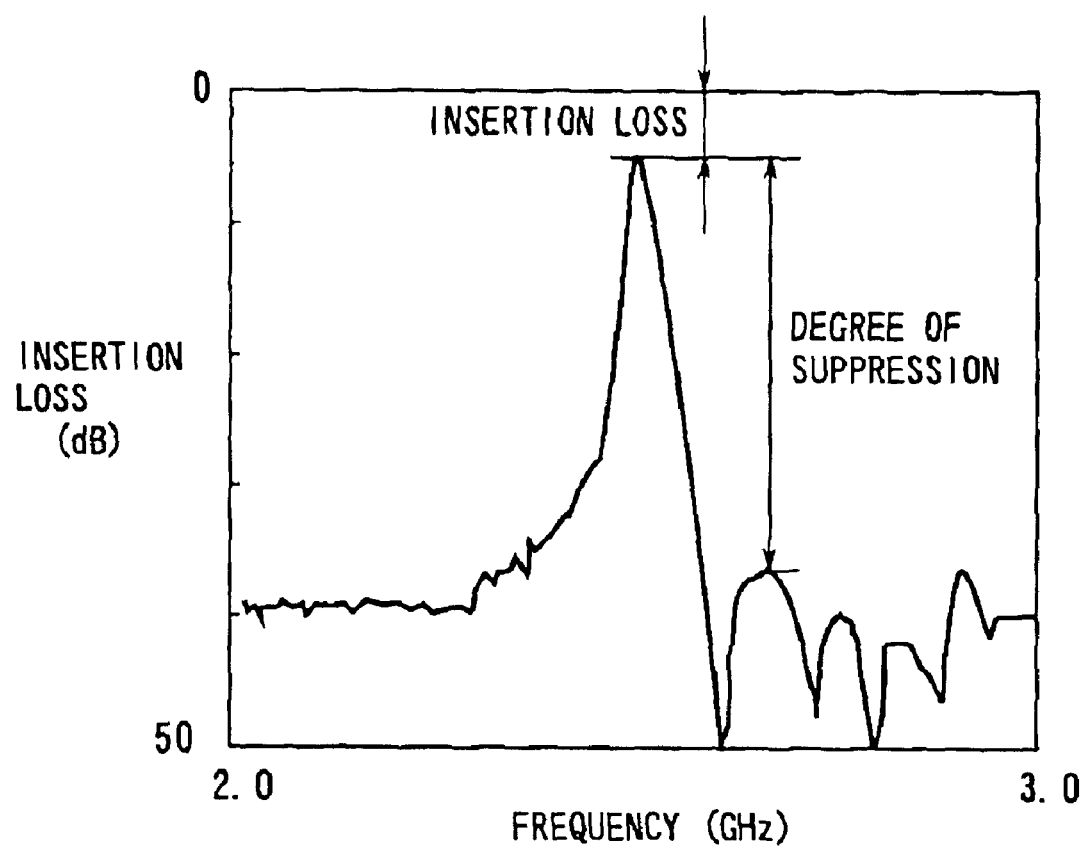
FIG. 8 illustrates the frequency characteristics of the magnetostatic wave device shown in FIG. 5.

The frequency characteristics of the magnetostatic wave device shown in FIG. 5 manufactured by the aforementioned method are now described. FIG. 8 illustrates the frequency characteristics of the magnetostatic wave device shown in FIG. 5. The field strength of the dc magnetic field H employed when measuring the frequency characteristics of the manufactured magnetostatic wave device is $2.4 \times 10^4$ A/m.

As shown in FIG. 8, the insertion loss is reduced to 5.0 dB and the degree of suppression exceeds 30 dB in the magnetostatic wave device shown in FIG. 5. Thus, the insertion loss can be reduced and the degree of suppression can be increased.

According to this embodiment, as hereinabove described, the quantity of spins not contributing to the resonance of the dominant modes can be reduced in the YIG films 2a and 2b due to the magnetic bias effect of the ferromagnetic layers 5a to 5d formed on both ends of the YIG films 2a and 2b, for improving homogeneity of magnetization in the YIG films 2a and 2b.

Consequently, the magnetostatic waves of the dominant modes can be efficiently propagated while suppressing propagation of magnetostatic waves of other modes, whereby the degree of suppression of the magnetostatic wave device can be improved and the insertion loss can be reduced.

As hereinabove described, the magnetostatic wave device according to the present invention can operate as a resonator having small insertion loss and a large degree of suppression, and is preferably applicable to filtering. For example, the magnetostatic wave device can be suitably employed as a high-frequency filter for a disturbance wave eliminator employing a spread spectrum communication system such as the direct sequence system, the frequency hopping system or the like, and as the so-called cellular radio system such as a portable telephone of a local LAN (local area network) or the CDMA (code division multiple access) system.

While the above description has been made with reference to a resonator formed by coupling two straight edge resonators with each other, the present invention may alternatively be applied to only a single resonator, or three or more resonators may be coupled with each other for forming a resonator. The magnetostatic wave device to which the present invention is applied is not particularly restricted to the aforementioned straight edge resonator, but the present invention is similarly applicable to various magnetostatic wave devices having other structures.

While two straight edge resonators are formed through a single groove in the aforementioned method, a plurality of grooves may alternatively be formed for preparing a plurality of straight edge resonators.

While the dc magnetic field H is applied along the direction parallel to the input electrode 1a for employing the magnetostatic surface wave in this embodiment, the direction for applying the dc magnetic field H is not particularly restricted to this example but the dc magnetic field H may be applied along another direction for employing a magnetostatic backward volume wave or a magnetostatic forward volume wave. The field strength of the dc magnetic field H is not restricted to the above example either but may be modified in various ways.

Two conductive layers of a conductor such as Cu or Al may be provided on both longitudinal ends of the YIG film 2a or 2b so that the two conductive layers are not parallel to each other. Also in this case, resonance of magnetostatic waves of other modes propagated along the longitudinal direction of the YIG film 2a or 2b can be suppressed similarly to the ferromagnetic layers having non-parallel opposite ends, whereby interference by other modes on the dominant mode can be reduced.

A disturbance wave eliminator according to the present invention is now described with reference to the drawings. While the following description is made with reference to a disturbance wave eliminator employing a band-pass magnetostatic wave filter as a magnetostatic wave device, the present invention is also applicable to a band rejection magnetostatic wave filter and a disturbance wave eliminator employing the same etc., for attaining a similar effect.

Figure 9:
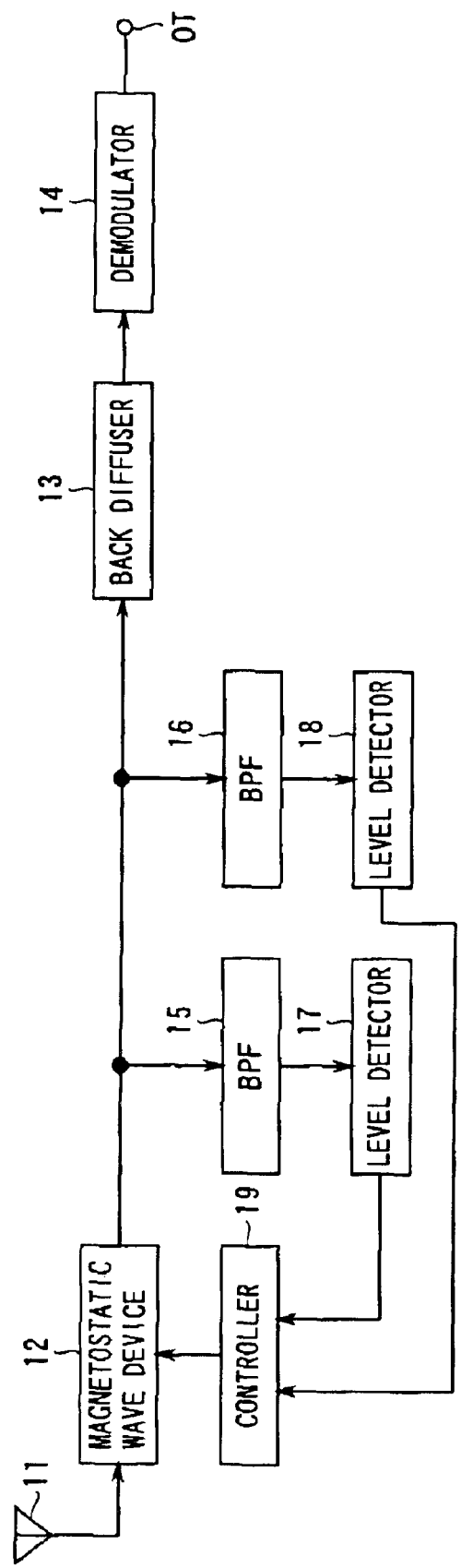
FIG. 9 is a block diagram showing the structure of a disturbance wave eliminator according to a third embodiment of the present invention.

FIG. 9 is a block diagram showing the structure of a disturbance wave eliminator according to a third embodiment of the present invention.

The disturbance wave eliminator shown in FIG. 9 comprises an antenna 11, a magnetostatic wave device 12, a back diffuser 13, a demodulator 14, band-pass filters (BPF) 15 and 16, level detectors 17 and 18 and a controller 19.

The antenna 11 receives a diffusion signal spectrally diffused in the direct sequence system, for example, and outputs the signal to the magnetostatic wave device 12. The magnetostatic wave device 12 attenuates a signal component exceeding a saturation level in the input signal, i.e., a disturbance wave mixed into the diffusion signal to an output saturation level, and outputs the same to the back diffuser 13 and the band-pass filters 15 and 16.

When the level of the diffusion signal output from the antenna 11 does not reach the saturation level of the magnetostatic wave device 12, an amplifier may be provided between the antenna 11 and the magnetostatic wave device 12 for amplifying the level of the diffusion signal up to the saturation level of the magnetostatic wave device 12 by the amplifier and outputting the amplified signal to the magnetostatic wave device 12.

The band-pass filter 15 extracts a signal component at an intermediate point on a low-frequency side edge portion of the pass band of the magnetostatic wave device 12 from the output signal of the magnetostatic wave device 12, and outputs the same to the level detector 17. The level detector 17 detects the level of the output signal from the band-pass filter 15 at the intermediate point of the low-frequency side edge portion of the pass band of the magnetostatic wave device 12 and outputs the result to the controller 19.

The band-pass filter 16 extracts a signal component at an intermediate point of a high-frequency side edge portion of the pass band of the magnetostatic wave device 12 from the output signal of the magnetostatic wave device 12, and outputs the same to the level detector 18. The level detector 18 detects the level of the output signal from the band-pass filter 16 at the intermediate point of the high-frequency side edge portion of the pass band of the magnetostatic wave device 12 and outputs the result to the controller 19.

The controller 19 changes the value of a current supplied to the magnetostatic wave device 12 in response to change of the level of the signal at the intermediate points of the low- and high-frequency side edge portions of the pass band of the magnetostatic wave device 12 output from the level detectors 17 and 18 thereby adjusting the strength of an auxiliary magnetic field of the magnetostatic wave device 12 and correcting drift of the pass band of the magnetostatic wave device 12.

The back diffuser 13 multiplies the output signal of the magnetostatic wave device 12 by the same code as a pseudo-noise code used for spectral diffusion on a transmission side for returning the diffusion signal to the signal of the original frequency band, while diffusing the disturbance wave mixed into the diffusion signal and outputting the same to the demodulator 14. The demodulator 14 performs demodulation responsive to the modulation system on the transmission side, and outputs demodulated data to an output terminal OT.

Figure 10:
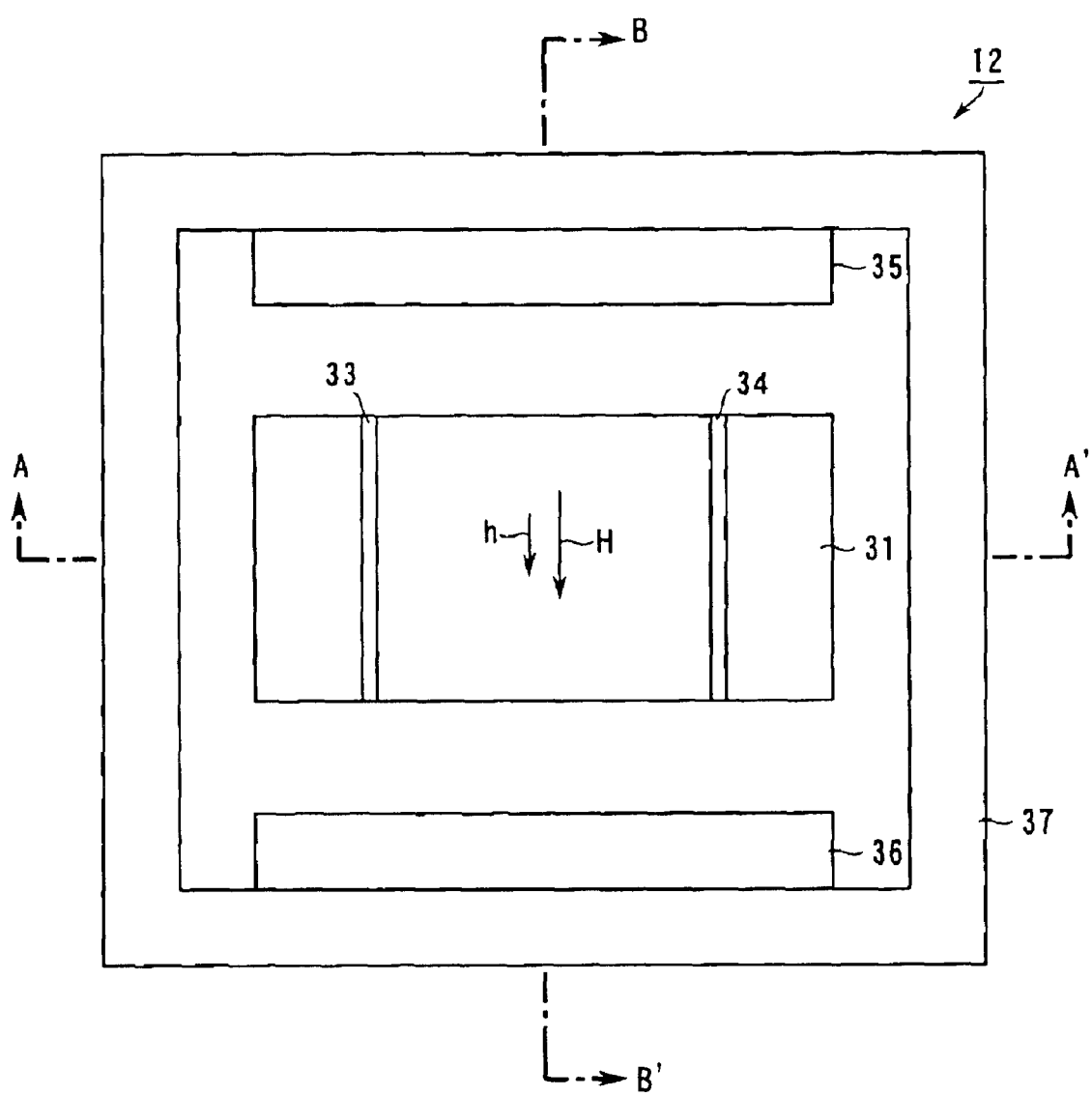
FIG. 10 is a plan view schematically showing the structure of the magnetostatic wave device shown in FIG. 9.

The magnetostatic wave device 12 shown in FIG. 9 is now described in detail. FIG. 10 is a plan view schematically showing the structure of the magnetostatic wave device 12 shown in FIG. 10, FIG. 11 is a sectional view taken along the line A–A' in FIG. 10, and FIG. 12 is a sectional view taken along the line B–B' in FIG. 10.

Figure 11:
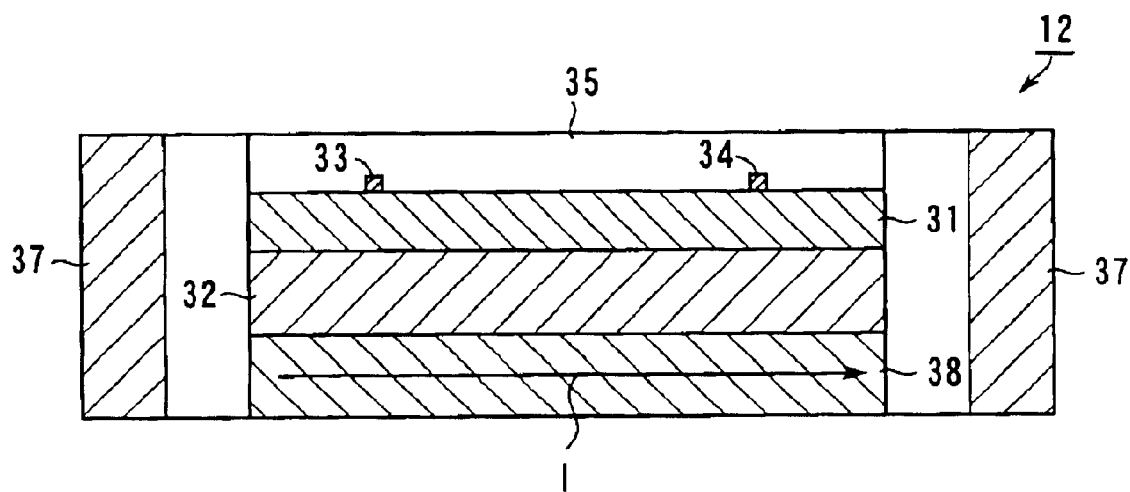
FIG. 11 is a sectional view taken along the line A–A' in FIG. 10.
Figure 12:
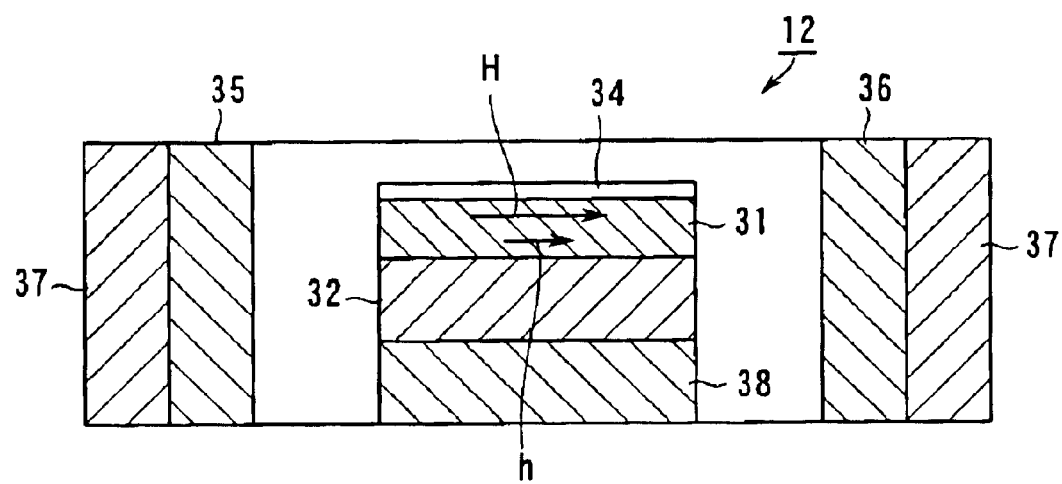
FIG. 12 is a sectional view taken along the line B–B' in FIG. 10.

The magnetostatic wave device 12 shown in FIGS. 10 to 12 comprises a YIG (yttrium-iron-garnet) film 31, a GGG (gadolinium-gallium-garnet) substrate 32, an input antenna electrode 33, an output antenna electrode 34, permanent magnets 35 and 36, a yoke 37 and an auxiliary magnetic field application film 38.

The YIG film 31 is formed on the GGG substrate 32, while the input antenna electrode 33 for receiving a signal output from the antenna 11 and the output antenna electrode 34 for converting a magnetostatic wave propagated through the YIG film 31 to an electric signal and outputting the electric signal to the back diffuser 13 etc. are arranged on the YIG film 31.

The permanent magnets 35 and 36 are formed on both sides of the YIG film 31, and fixed to the yoke 37 for refluxing magnetic fluxes generated from the permanent magnets 35 and 36 and forming a closed circuit. Therefore, the magnetic flux generated from the permanent magnet 35 is guided to the permanent magnet 36 through the YIG film 31 and refluxed in the yoke 37, for applying a constant dc magnetic field H to the YIG film 31 in parallel with the input antenna electrode 33 and the output antenna electrode 34. A magnetic field generator generating the dc magnetic field H is not particularly restricted to that formed by the permanent magnets 35 and 36 or the like but another magnetic field generator formed by electromagnets or the like may alternatively be employed.

The auxiliary magnetic field application film 38 is arranged under the GGG substrate 32. As shown in FIG. 11, the controller 19 feeds a current I to the auxiliary magnetic field application film 38 in a direction perpendicular to the dc magnetic field H, while applying an auxiliary magnetic field h to the YIG film 31 in parallel with the dc magnetic field H.

The YIG film 31 of a ferrimagnetic substance made of a magnetostatic wave material propagating a magnetostatic wave is formed by a $Y_3Fe_5O_{12}$ single-crystalline film grown on the surface of the GGG substrate 32 by liquid phase epitaxy, for example, while part (e.g., not more than 20%) of Fe may be replaced with Ga, Al, Sc or In. Alternatively, another magnetostatic wave material may be employed so far as the same can propagate a magnetostatic wave.

Saturation magnetization (Ms) in the case of employing $Y_3Fe_5O_{12}$ is 1780 G, while the gyromagnetic resonance linewidth ΔH of the YIG film 31, which is 0.5 to 2.0 Oe, for example, depends on the crystallinity of the material and is reduced as the crystallinity is improved. The thickness of the YIG film 31 may be not more than about 10 μm, for example.

The GGG substrate 32 is made of a dielectric material such as $Gd_3Ga_5O_{12}$, for example, and the thickness thereof is 30 μm, for example.

The input antenna electrode 33 and the output antenna electrode 34 are made of a conductive material such as Al, Cu, Au or Ag, for example, and the sectional shape thereof is not particularly restricted to the quadruple shape shown in FIGS. 10 to 12 but may be another shape such as a circular shape.

The auxiliary magnetic field application film 38, made of a conductive metal such as Cu or Al, for example, is prepared from Cu having resistivity of 2.3 μΩcm in this embodiment. When the thickness of the GGG substrate 32 is 30 μm, for example, the auxiliary magnetic field h can be generated with field strength of 5 Oe (370 A/m) by feeding the current I of 70 mA to the auxiliary magnetic field application film 38 along the direction shown in FIG. 11. In this case, the resistivity of the auxiliary magnetic field application film 38 is set to the aforementioned value and hence the heating value of the auxiliary magnetic field application film 38 can be suppressed so that the auxiliary magnetic field h can be applied with sufficient field strength without changing the temperature of the YIG film 31.

According to this embodiment, the YIG film 31 corresponds to the magnetic body, the permanent magnets 35 and 36 and the yoke 37 correspond to the dc magnetic field applier, and the auxiliary magnetic application film 38 corresponds to the auxiliary magnetic field applier. The band-pass filters 15 and 16, the level detectors 17 and 18 and the controller 19 correspond to the control unit, the band-pass filters 15 and 16 and the level detectors 17 and 18 correspond to the detector and the insertion loss detector, and the controller 19 corresponds to the current controller.

Operations of the disturbance wave eliminator having the aforementioned structure are now described. First, the antenna 11 receives a diffusion signal spectrally diffused with a certain specific pseudo-noise code. It is assumed that a disturbance wave is mixed into this diffusion signal and the antenna 11 also receives this disturbance wave at the same time. The diffusion signal has spectral characteristics diffused over a wide frequency range at a low level, while the disturbance wave has spectral characteristics of a high level in a narrow frequency range.

The diffusion signal and the disturbance wave received in the antenna 11 are output to the magnetostatic wave device 12 and input in the input antenna electrode 33, which in turn generates a high-frequency magnetic field corresponding to the input signal. At this time, the dc magnetic field H and the auxiliary magnetic field h are applied in parallel with the input antenna electrode 33, so that the high-frequency magnetic field induces a magnetostatic surface wave in the YIG film 31 and this magnetostatic surface wave propagates from the input antenna electrode 33 toward the output antenna electrode 34. The output antenna electrode 34 converts the magnetostatic surface wave propagating through the YIG film 31 to an electric signal, which in turn is output as an output signal.

Consequently, the magnetostatic wave device 12 operates as a band-pass magnetostatic wave filter having a prescribed pass band, for attenuating an input signal component exceeding a saturation level, i.e., the disturbance wave in the pass band while passing an input signal component below the saturation level, i.e., the diffusion signal. Therefore, the part of the disturbance wave exceeding the saturation level is attenuated, while the diffusion signal is passed as such.

Figure 13:
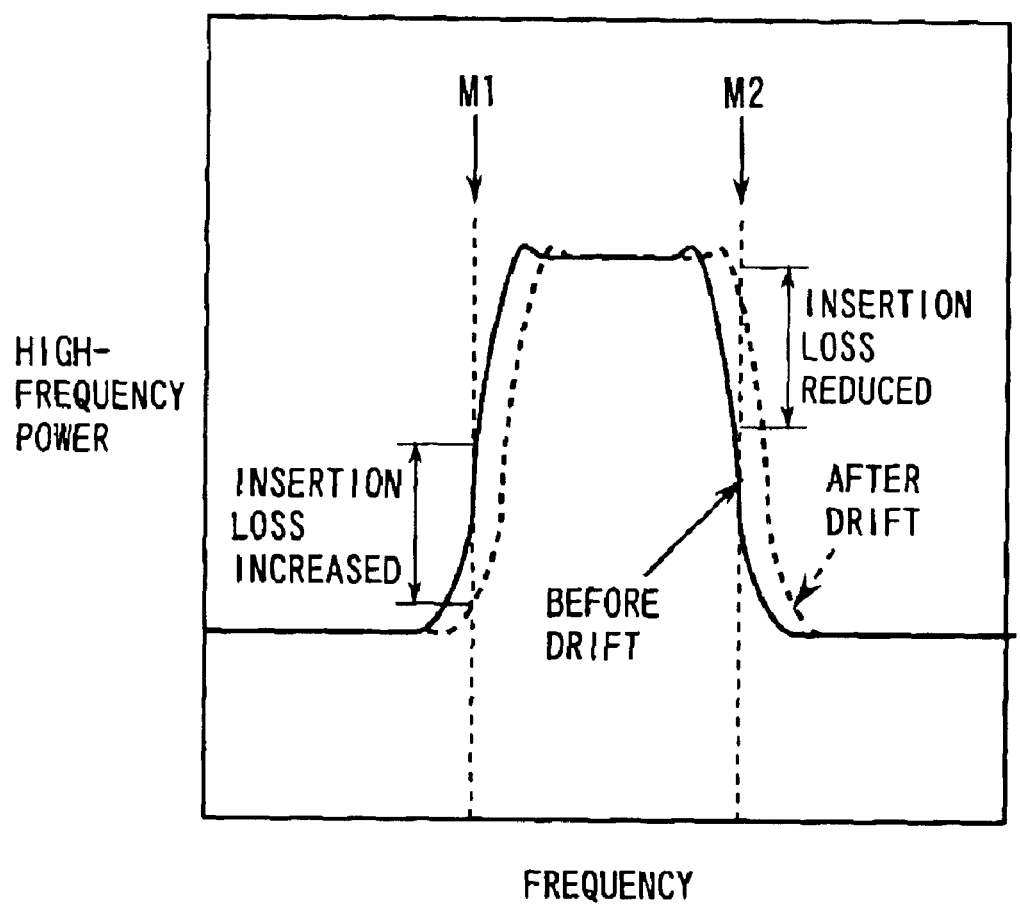
FIG. 13 illustrates the frequency characteristics of the magnetostatic wave device shown in FIG. 9.

FIG. 13 illustrates the frequency characteristics of the magnetostatic wave device 12 shown in FIG. 9. The magnetostatic wave device 12 has the frequency characteristics shown by solid lines in FIG. 13, for example, and operates as a band-pass magnetostatic wave filter. When the operating temperature of the magnetostatic wave device 12 shifts to a higher temperature side, the frequency characteristics shown by the solid lines drift to the frequency characteristics shown by broken lines, and the pass band of the magnetostatic wave device 12 drifts toward the higher frequency side.

When the operating temperature of the magnetostatic wave device 12 is increased and the pass band of the magnetostatic wave device 12 drifts toward the higher frequency side, therefore, the insertion loss at a point M1 of measurement is increased while that at a point M2 of measurement is reduced. When the operating temperature of the magnetostatic wave device 12 is reduced to the contrary, the pass band of the magnetostatic wave device 12 drifts to a lower frequency side, while the insertion loss at the point M1 of measurement is reduced and that at the point M2 of measurement is increased.

According to this embodiment, the band-pass filter 15 extracts a signal having the frequency of the point M1 of measurement and outputs the extracted signal to the level detector 17, which in turn detects the level of the insertion loss of the magnetostatic wave device 12 at the point M1 of measurement.

Similarly to the above, the band-pass filter 16 extracts a signal having the frequency of the point M2 of measurement and outputs the extracted signal to the level detector 18, which in turn detects the level of the insertion loss of the magnetostatic wave device 12 at the point M2 of measurement.

Thus, the insertion loss remarkably changes on both of low- and high-frequency side edge portions of the pass band when the pass band of the magnetostatic wave device 12 drifts, and hence the drift direction and the drift quantity of the pass band of the magnetostatic wave device 12 can be precisely detected with high sensitivity by detecting the insertion loss at intermediate potions of the low- and high-frequency side edge portions of the pass band, i.e., the points M1 and M2 of measurement. Also when ripple or the like takes place on one of the two points M1 and M2 of measurement, change of the filtering band can be reliably detected from the other point of measurement.

When detecting that the pass band of the magnetostatic wave device 12 drifts toward the higher frequency side from the insertion loss measured by the level detectors 17 and 18 in the aforementioned manner, the controller 19 reduces the value of the current I applied to the auxiliary magnetic field application film 38 for reducing the strength of the auxiliary magnetic field h generated from the auxiliary magnetic field application film 38. Consequently, the pass band of the magnetostatic wave device 12 shifts to the higher frequency side. Thus, the pass band of the magnetostatic wave device 12 can be returned to the original proper band.

The points of measurement for the insertion loss are not particularly restricted to the aforementioned two points but only a point on the low- or high-frequency side of the pass band may be employed as the point of measurement, or three or more points of measurement may be employed.

As hereinabove described, the auxiliary magnetic field application film 38 applies the auxiliary magnetic field h in response to the controller 19 or the like so that the magnetostatic wave device 12 regularly has the optimum pass band and the disturbance wave is attenuated to the output saturation level of the magnetostatic wave device 12 while the diffusion signal is passed without partially extinguishing the signal component of the diffusion signal so that the diffusion signal and the disturbance wave are input in the back diffuser 13 in a properly filtered state.

The back diffuser 13 re-multiplies the diffusion signal including the disturbance wave by the same code as the pseudo-noise code received on the transmission side for returning the diffusion signal to the original signal having a high level in a narrowband and spectrally diffusing the disturbance wave over a wide frequency range at a low level. Finally, the demodulator 14 demodulates the signal back-diffused by the back diffuser 13 in response to the modulation system on the transmission side for returning the same to the original data with no error, so that the data is output from the output terminal OT.

According to this embodiment, as hereinabove described, the band-pass filters 15 and 16 and the level detectors 17 and 18 detect the insertion loss at the points M1 and M2 of measurement so that the controller 19 controls the value of the current I supplied to the auxiliary magnetic field application film 38 in response to change of the detected insertion loss. Also when the pass band of the magnetostatic wave device 12 drifts due to temperature change or the like, therefore, the pass band of the magnetostatic wave device 12 can be regularly set in the proper range by controlling the value of the current I fed to the auxiliary magnetic field application film 38 and adjusting the strength of the auxiliary magnetic field h, whereby communication quality of the disturbance wave eliminator can be regularly kept in an excellent state.

A disturbance wave eliminator according to a fourth embodiment of the present invention is now described. The disturbance wave eliminator according to the fourth embodiment is formed by replacing the magnetostatic wave device 12 applying the auxiliary magnetic field h by the auxiliary magnetic field application film 38 in the disturbance wave eliminator shown in FIG. 9 with a magnetostatic wave device 12' applying an auxiliary magnetic field from electromagnets while controlling a current applied to the electromagnets by a controller 19 or the like. The remaining structure of this disturbance wave eliminator is similar to that of the disturbance wave eliminator shown in FIG. 9, and hence this disturbance wave eliminator is not illustrated but only the magnetostatic wave device 12' employing electromagnets is now described in detail.

Figure 14:
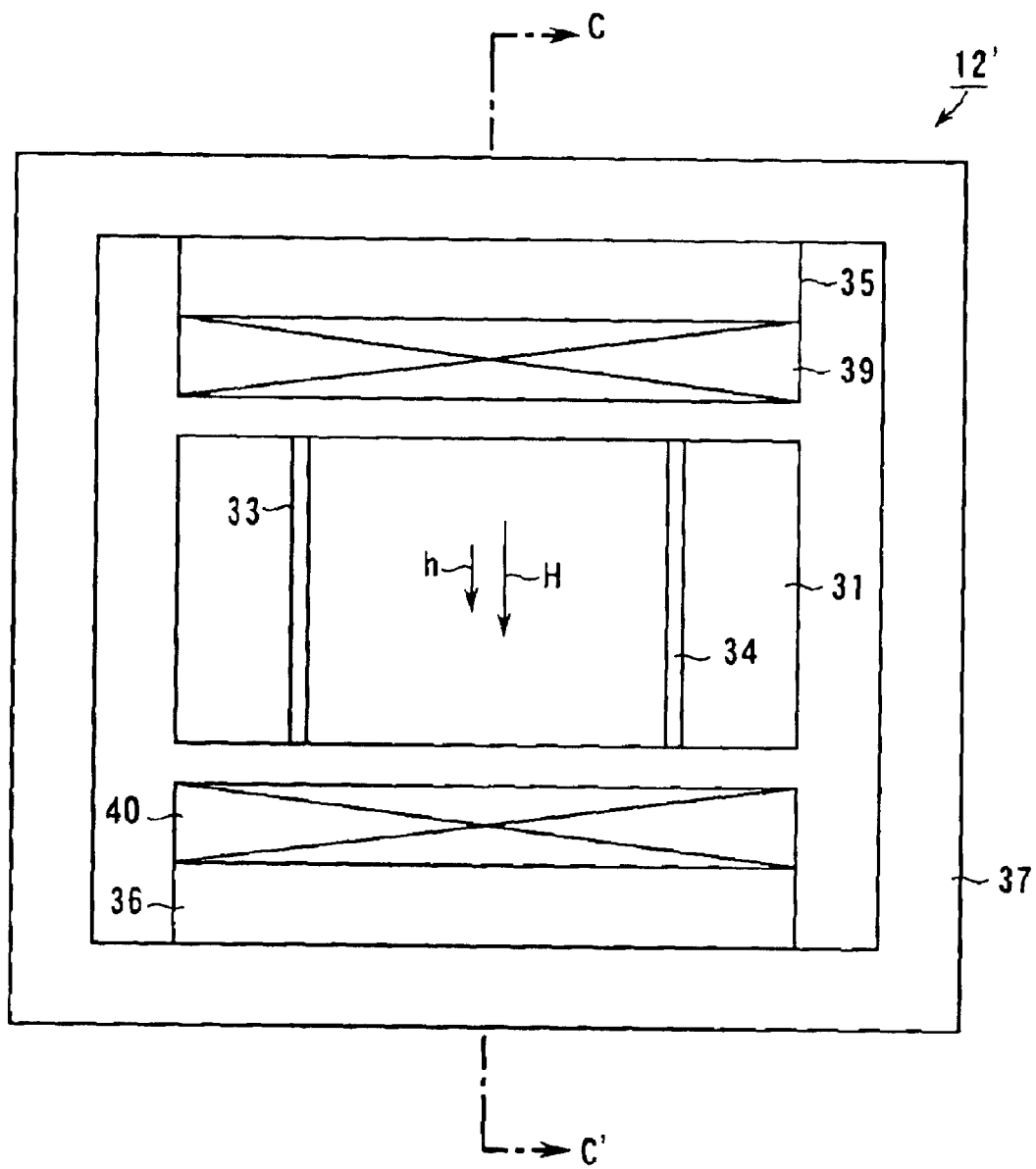
FIG. 14 is a schematic plan view showing the structure of a magnetostatic wave device employed for a disturbance wave eliminator according to a fourth embodiment of the present invention.
Figure 15:
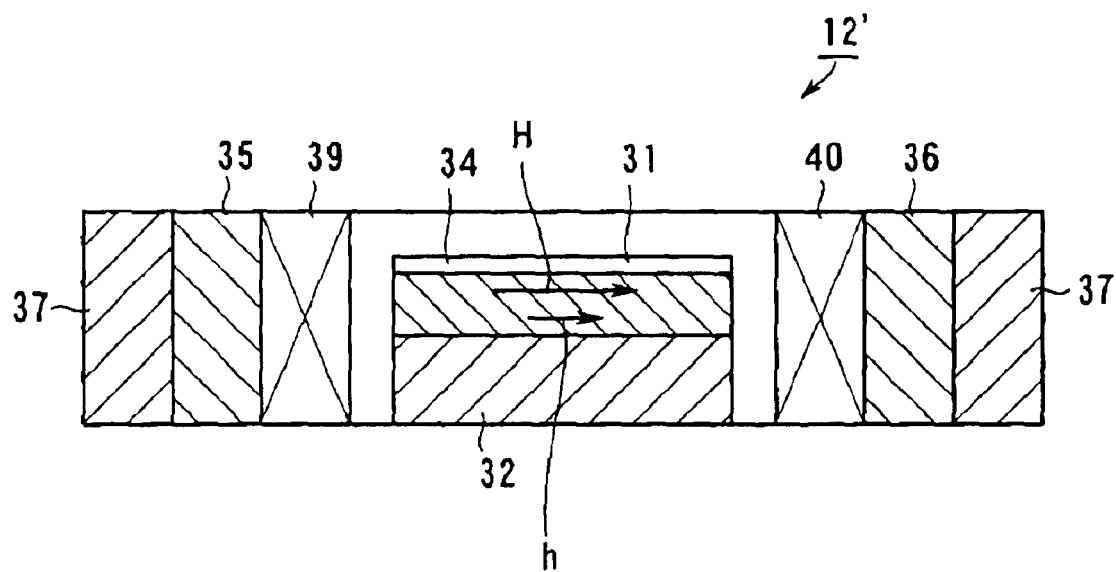
FIG. 15 is a sectional view taken along the line C–C' in FIG. 14.

FIG. 14 is a schematic plan view showing the structure of the magnetostatic wave device 12' employed for the disturbance wave eliminator according to the fourth embodiment of the present invention, and FIG. 15 is a sectional view taken along the line C–C' in FIG. 14.

The magnetostatic wave device 12' shown in FIGS. 14 and 15 is different from the magnetostatic wave device 12 shown in FIGS. 10 to 12 in a point that the auxiliary magnetic field application film 38 is omitted and electromagnets 39 and 40 are newly added to both sides of a YIG film 31. The remaining points of the magnetostatic wave device 12' are similar to those of the magnetostatic wave device 12 shown in FIGS. 10 to 12, and hence identical parts are denoted by the same reference numerals and only different points are now described in detail.

As shown in FIGS. 14 and 15, the electromagnet 39 is arranged between a permanent magnet 35 and the YIG film 31, while the electromagnet 40 is arranged between the YIG film 31 and a permanent magnet 36. When the controller 19 supplies a prescribed current to the electromagnets 39 and 40, therefore, an auxiliary magnetic field h can be applied in the same direction as a dc magnetic field H applied by the permanent magnets 35 and 36, similarly to the first embodiment.

Figure 16:
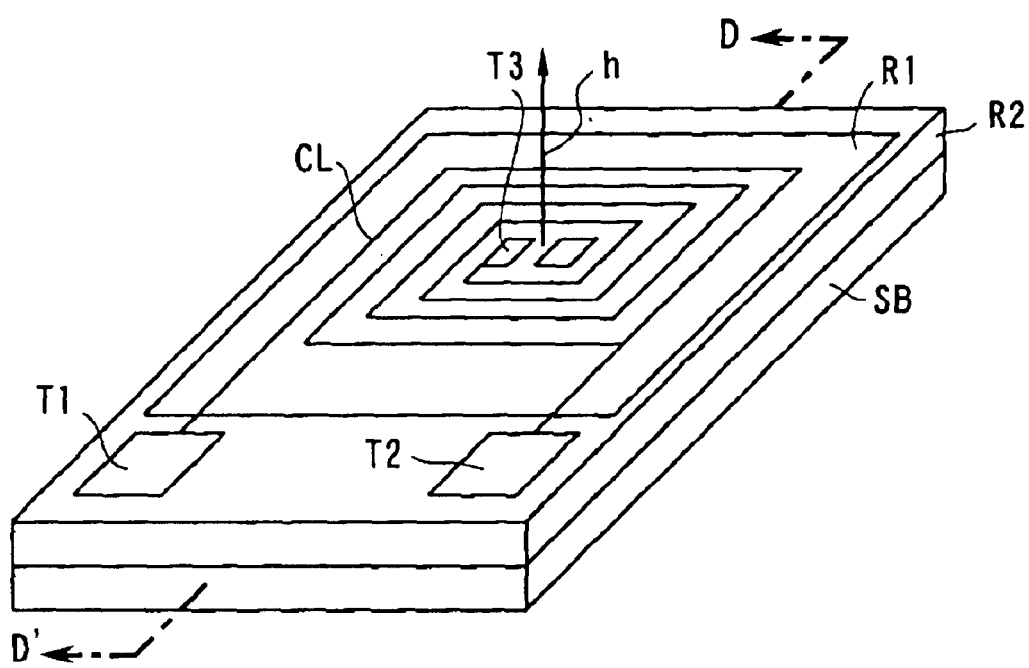
FIG. 16 is a perspective view showing the structure of an exemplary thin-film coil employed as an electromagnet shown in FIG. 14.
Figure 18:
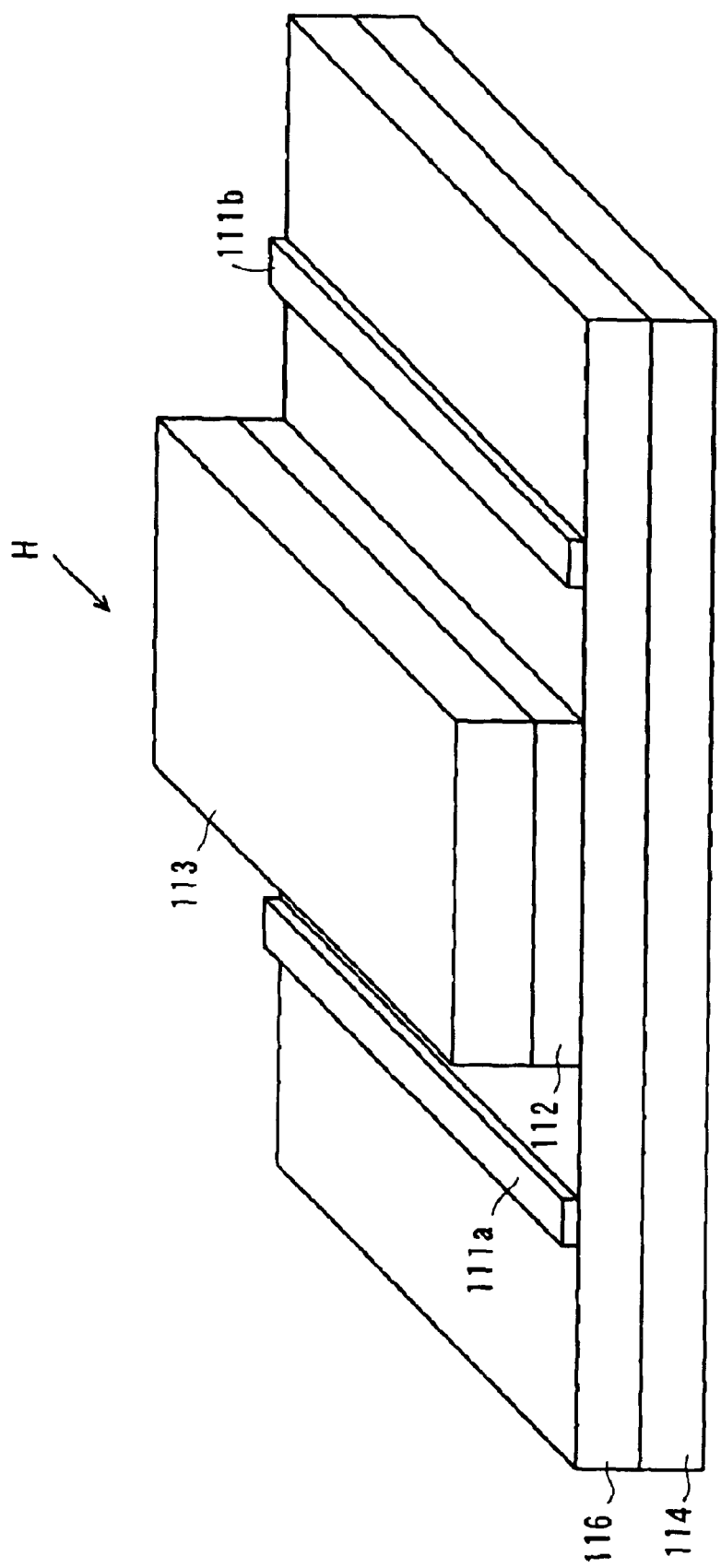
FIG. 18 is a schematic perspective view showing the structure of a straight edge resonator as an exemplary conventional magnetostatic wave device.
Figure 19:
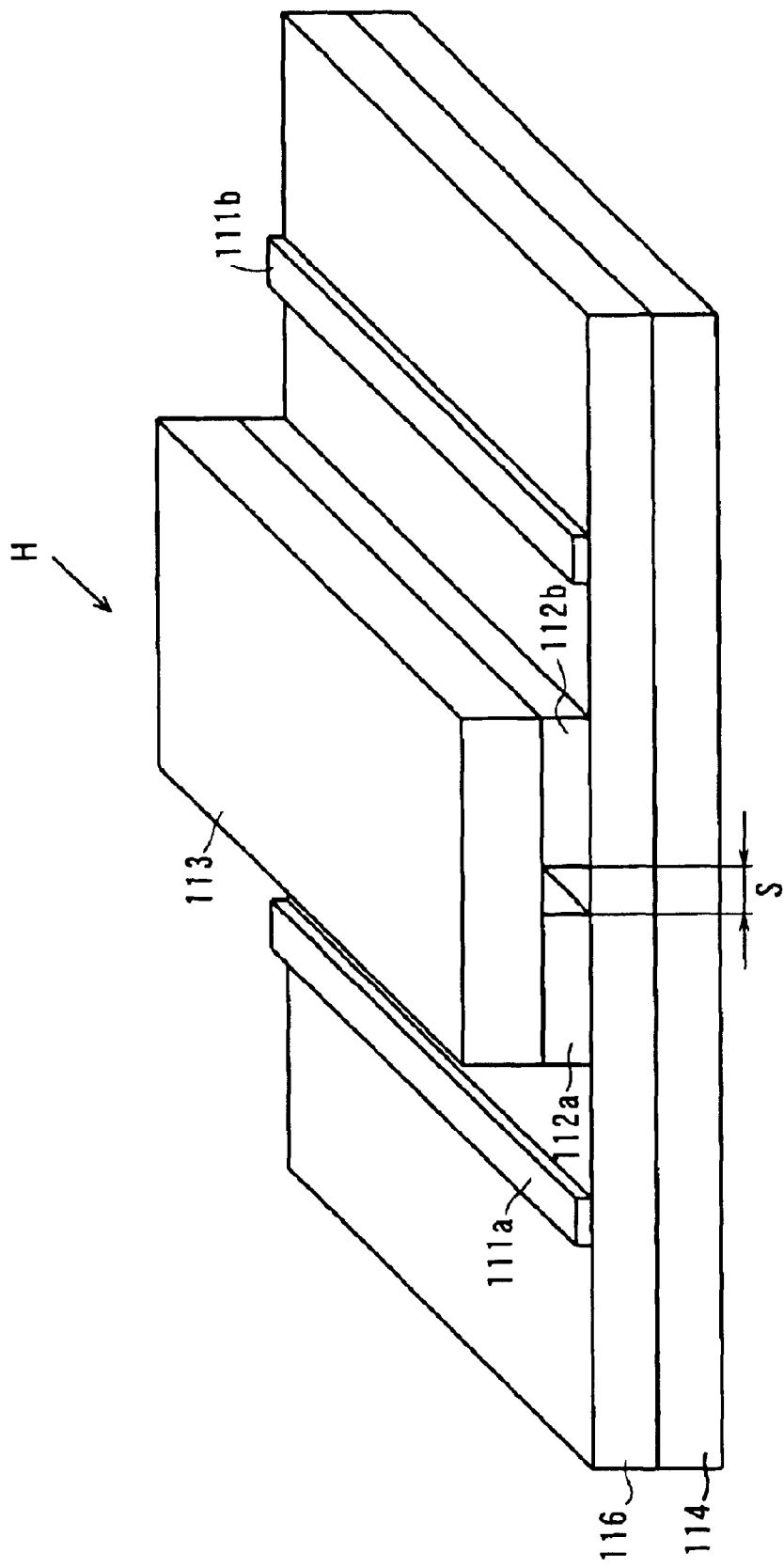
FIG. 19 is a schematic perspective view showing the structure of another conventional magnetostatic wave device formed by coupling two straight edge resonators with each other.
Figure 20:
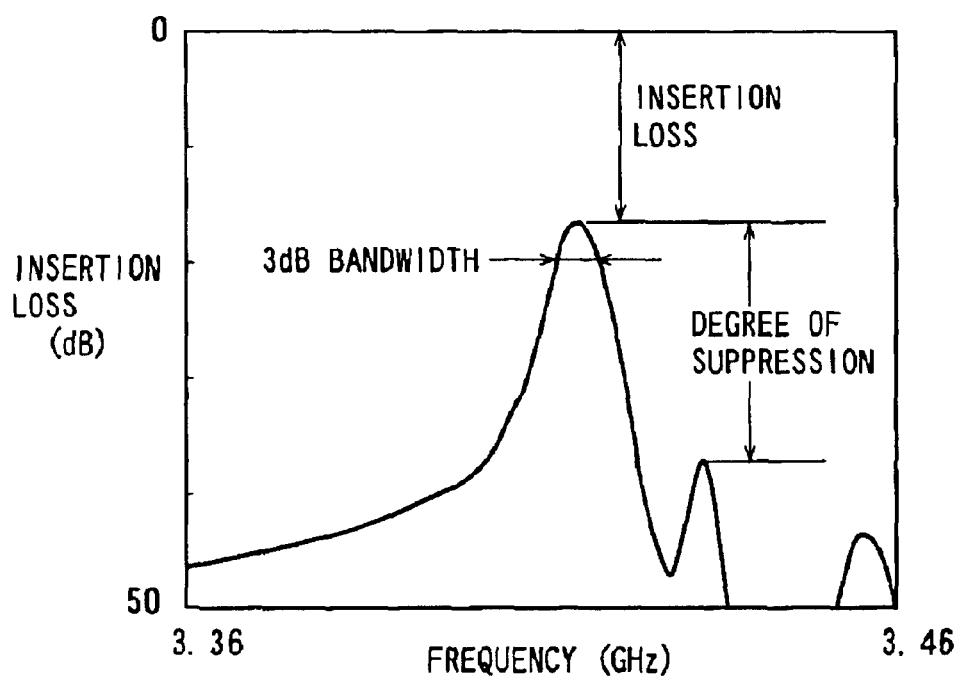
FIG. 20 illustrates the frequency characteristics of the conventional magnetostatic wave device shown in FIG. 19.
Figure 21:
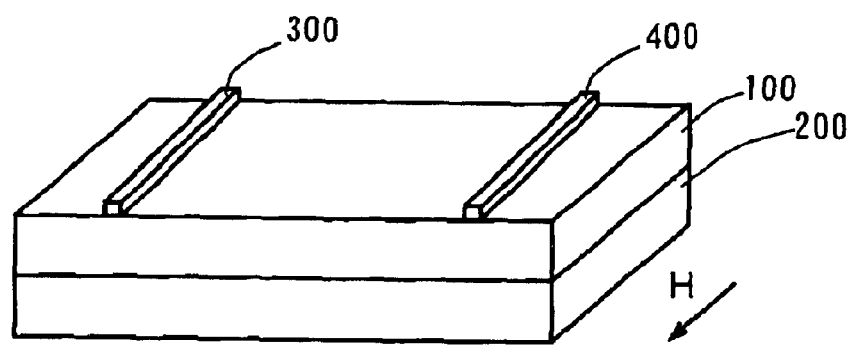
FIG. 21 is a perspective view showing the structure of still another conventional magnetostatic wave device.
Figure 22:
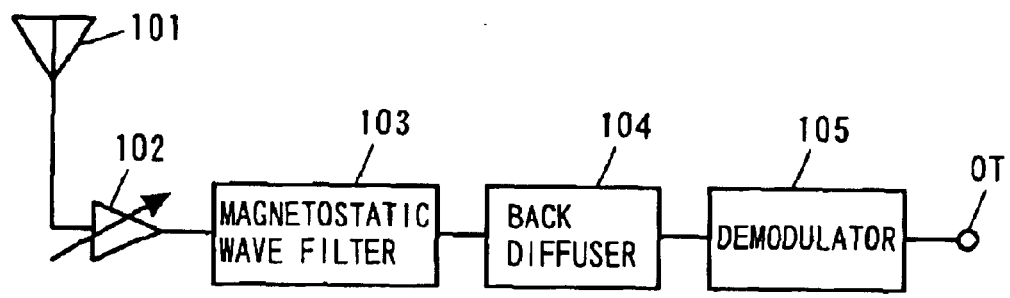
FIG. 22 is a block diagram showing the structure of a conventional disturbance wave eliminator employing the magnetostatic wave device shown in FIG. 21.
Figure 23:
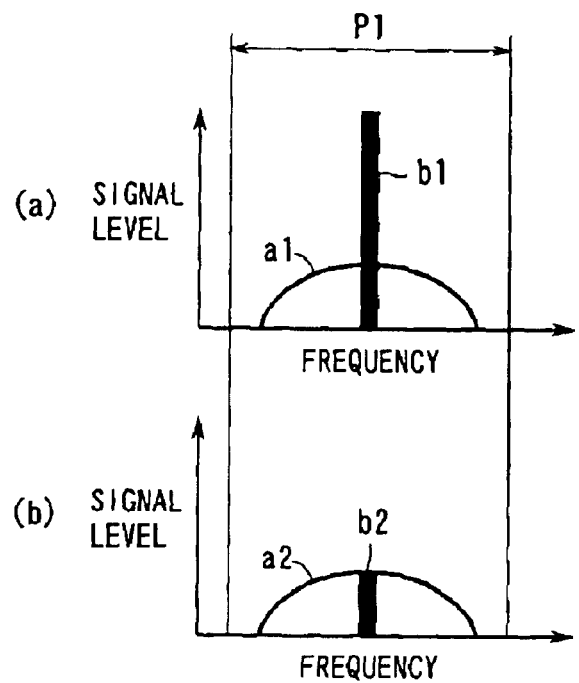
FIGS. 23($a$) and 23($b$) illustrate the spectra of an input signal and an output signal in and from a magnetostatic wave filter shown in FIG. 22.
Figure 24:
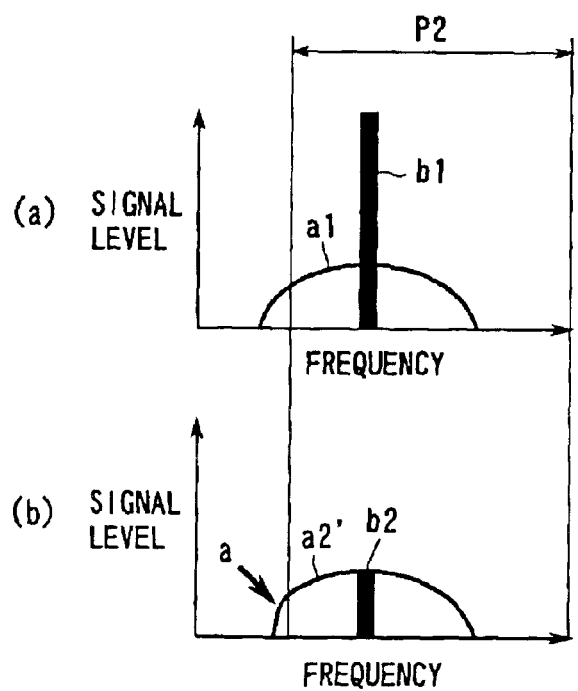
FIGS. 24($a$) and 24($b$) are diagrams for illustrating a drift state of a pass band caused when the temperature shifts to a higher side in the conventional disturbance wave eliminator shown in FIG. 22.

FIG. 16 is a perspective view showing an exemplary structure of a thin-film coil employed as the electromagnet 39 or 40 shown in FIG. 14, and FIG. 17 is a sectional view taken along the line D–D' in FIG. 16.

As shown in FIGS. 16 and 17, a coil CL is spirally formed on a substrate SB through prescribed insulating layers R1 and R2. The insulating layer R1 made of an organic resist layer baked at a prescribed temperature is formed around the coil CL, and the insulating layer R2 formed by baking a similar resist layer at a higher temperature for further improving hardness is formed around the insulating layer R1.

Such a thin-film coil can be prepared by a technique similar to that for preparing a thin-film head for a general hard disk drive and the material for the coil CL is prepared from Cu, for example, while the materials for the insulating layers R1 and R2 and the substrate SB are not particularly restricted.

An end of the coil CL is connected to a terminal T1, and the other inner end thereof is connected to a terminal T3. The terminal T3 is connected to a terminal T2 through a prescribed wire. When the controller 19 applies a prescribed current to the terminals T1 and T2, therefore, a current flows to the coil CL for generating the auxiliary magnetic field h as shown in FIG. 16.

The coil CL shown in FIGS. 16 and 17, illustrated as having only three turns for simplifying the illustration, has 75 turns in practice, and can generate the auxiliary magnetic field h with field strength of 5 Oe (370 A/m) when a current of 5 A is applied thereto from the terminals T1 and T2.

According to this embodiment, the electromagnets 39 and 40 correspond to the auxiliary magnetic field applier, and the remaining points are similar to those of the third embodiment.

Also in this embodiment, as hereinabove described, the controller 19 controls the value of the current fed to the electromagnets 39 and 40 and adjusts the strength of the auxiliary magnetic field h for correcting drift of the pass band of the magnetostatic wave device 12', whereby an effect similar to that of the third embodiment can be attained for regularly setting the pass band of the magnetostatic wave device 12' to a proper range.

While the disturbance wave eliminator shown in FIG. 9 employs the magnetostatic wave device 12 shown in FIGS. 10 to 12 or the magnetostatic wave device 12' shown in FIGS. 14 and 15, the magnetostatic wave device shown in FIGS. 1 and 2 or that shown in FIGS. 5 and 6 may alternatively be employed as the magnetostatic wave device 12 in the disturbance wave eliminator shown in FIG. 9.

While each of the above embodiments has been described with reference to the case of eliminating the disturbance wave from the diffusion signal spectrally diffused in the direct sequence system, the present invention is not particularly restricted to the diffusion signal according to this system but can also be applied to another diffusion signal spectrally diffused by the frequency hopping system or the like.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A magnetostatic wave device comprising a magnetic layer, having first and second end surfaces, made of a magnetostatic wave material, wherein a magnetostatic wave propagates between said first end surface and said second end surface in said magnetic layer, said second end surface has a first part having a first interval with respect to said first end surface and a second part having a second interval different from said first interval with respect to said first end surface, and said magnetostatic wave is reflected at said first and second surfaces.

2. The magnetostatic wave device according to claim 1, wherein said first part includes a first end surface part arranged in parallel with said first end surface at said first interval, and said second part includes a second end surface part arranged in parallel with said first end surface at said second interval.

3. The magnetostatic wave device according to claim 1, being a resonator resonating said magnetostatic wave between said first and second end surfaces.

4. The magnetostatic wave device according to claim 1, wherein said magnetic layer includes first and second magnetic layers arranged at a prescribed interval in a direction intersecting with said first and second end surfaces.

5. The magnetostatic wave device according to claim 4, further comprising an input line arranged on one of said first and second magnetic layers and an output line arranged on the other one of said first and second magnetic layers.

6. The magnetostatic wave device as recited in claim 1, wherein the magnetostatic wave has a wavelength twice each of the first and second intervals.

7. A magnetostatic wave device comprising a magnetic layer, having first and second end surfaces, made of a magneto static wave material in which a magnetostatic wave propagates, wherein said magnetic layer is separated into a plurality of magnetic layers by at least one groove formed between said first and second end surfaces, and said groove has a stepwise section having at least one step.

8. The magnetostatic wave device according to claim 7, wherein
said groove is formed by machining.

9. The magnetostatic wave device according to claim 7, wherein
a sectional shape of said groove is deepest at the center of said groove and said sectional shape is mirror-symmetrical.

* * * * *